US012754698B2

(12) United States Patent
Maharana et al.

(10) Patent No.: US 12,754,698 B2
(45) Date of Patent: *Oct. 6, 2026

(54) REMOTE DIRECT MEMORY ACCESS IN MULTI-TIER MEMORY SYSTEMS

(71) Applicant: Micron Technology, Inc., Boise, ID (US)

(72) Inventors: Parag R. Maharana, Dublin, CA (US); Anirban Ray, Santa Clara, CA (US); Gurpreet Anand, Pleasanton, CA (US); Samir Mittal, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/645,761

(22) Filed: Apr. 25, 2024

(65) Prior Publication Data

US 2024/0272835 A1 Aug. 15, 2024

Related U.S. Application Data

(63) Continuation of application No. 17/382,200, filed on Jul. 21, 2021, now Pat. No. 11,977,787, which is a (Continued)

(51) Int. Cl.
*G06F 3/06* (2006.01)
*G06F 12/00* (2006.01)
(Continued)

(52) U.S. Cl.
CPC .............. *G06F 3/067* (2013.01); *G06F 12/00* (2013.01); *G06F 13/28* (2013.01);
(Continued)

(58) Field of Classification Search
CPC ...... G06F 3/067; G06F 9/45558; G06F 12/00; G06F 12/0623; G06F 12/0669;
(Continued)

(56) References Cited

U.S. PATENT DOCUMENTS

| | | | |
|---|---|---|---|
| 5,390,334 | A | 2/1995 | Harrison |
| 5,727,150 | A | 3/1998 | Laudon et al. |

(Continued)

FOREIGN PATENT DOCUMENTS

| | | |
|---|---|---|
| CN | 104391803 | 3/2015 |
| CN | 106506275 | 3/2017 |

(Continued)

OTHER PUBLICATIONS

Wilson, Tracy. "How PCI Express Works." Retrieved from the Internet <https://computer.howstuffworks.com/pci-express.htm>, Mar. 30, 2021.

(Continued)

*Primary Examiner* — Larry T Mackall
(74) *Attorney, Agent, or Firm* — Greenberg Traurig

(57) ABSTRACT

A memory system having memory components, a remote direct memory access (RDMA) network interface card (RNIC), and a host system, and configured to: allocate a page of virtual memory for an application; map the page of virtual memory to a page of physical memory in the memory components; instruct the RNIC to perform an RDMA operation; perform, during the RDMA operation, a data transfer between the page of physical memory in the plurality of memory components and a remote device that is connected via a computer network to the remote direct memory access network interface card; and at least for a duration of the data transfer, lock a mapping between the page of virtual memory and the page of physical memory in the memory components.

15 Claims, 10 Drawing Sheets

Related U.S. Application Data continuation of application No. 16/107,624, filed on Aug. 21, 2018, now Pat. No. 11,099,789.

(60) Provisional application No. 62/626,523, filed on Feb. 5, 2018.

(51) Int. Cl.

| | |
|---|---|
| ***G06F 13/28*** | (2006.01) |
| ***G06F 15/173*** | (2006.01) |
| ***G11C 14/00*** | (2006.01) |
| ***H04L 67/1097*** | (2022.01) |

(52) U.S. Cl.
CPC .... *G06F 15/17331* (2013.01); *G11C 14/0009* (2013.01); *H04L 67/1097* (2013.01)

(58) Field of Classification Search
CPC ............. G06F 12/0868; G06F 12/1081; G06F 12/126; G06F 13/16; G06F 13/28; G06F 15/17331; G06F 2009/45583; G06F 2212/1024; G06F 2212/154; G06F 2212/502; G06F 2212/657; G06F 2212/7201; G06N 3/065; G06N 3/08; G11C 14/0009; H04L 67/1097
See application file for complete search history.

(56) References Cited

U.S. PATENT DOCUMENTS 5,909,540 A 6/1999 Carter et al.
5,918,229 A 6/1999 Davis et al.
6,026,475 A 2/2000 Woodman
6,230,260 B1 5/2001 Luick
6,247,097 B1 6/2001 Sinharoy
6,279,138 B1 8/2001 Jadav et al.
6,473,845 B1 10/2002 Hornung et al.
7,376,681 B1 5/2008 Todd et al.
8,082,400 B1 12/2011 Chang et al.
8,117,373 B2 2/2012 Berlin
8,131,814 B1 3/2012 Schlansker et al.
8,135,933 B2 3/2012 Fisher et al.
8,316,187 B2 11/2012 Pothireddy
8,352,709 B1 1/2013 Glasco et al.
8,560,761 B2 10/2013 Tzeng
8,700,724 B2 4/2014 McDaniel et al.
8,799,554 B1 8/2014 Vincent et al.
8,825,937 B2 9/2014 Atkisson et al.
8,838,887 B1 9/2014 Burke et al.
8,868,842 B2 10/2014 Yano et al.
8,930,647 B1 1/2015 Smith
8,965,819 B2 2/2015 Tirunagari
8,996,834 B2 3/2015 Brenner et al.
9,043,530 B1 5/2015 Sundaram et al.
9,047,017 B1 6/2015 Dolan et al.
9,104,555 B2 8/2015 Liebowitz et al.
9,122,503 B1 9/2015 Hoff
9,342,453 B2 5/2016 Nale et al.
9,535,740 B1 1/2017 Graham et al.
9,619,408 B2 4/2017 Nale et al.
9,697,130 B2 7/2017 Karippara et al.
9,817,739 B1 11/2017 Pise et al.
9,910,618 B1 3/2018 Curley et al.
9,996,370 B1 6/2018 Khafizov et al.
10,019,279 B2 7/2018 Bacher et al.
10,120,797 B1 11/2018 Foley et al.
10,223,371 B2 3/2019 Thirumal
10,241,943 B2 3/2019 Nale et al.
10,282,322 B2 5/2019 Nale et al.
10,282,323 B2 5/2019 Nale et al.
10,289,566 B1 5/2019 Dalmatov et al.
10,298,496 B1 5/2019 Nakibly et al.
10,339,056 B2 7/2019 Joshi et al.
10,394,789 B1 8/2019 Animesh et al.
10,430,723 B1 10/2019 Tzur et al.
10,514,855 B2 12/2019 Voigt
10,725,663 B2 7/2020 Awasthi et al.
10,782,908 B2 9/2020 Mittal et al.
10,852,949 B2 12/2020 Frolikov et al.
10,877,892 B2 12/2020 Ray et al.
10,880,401 B2 12/2020 Maharana et al.
11,099,789 B2 8/2021 Maharana et al.
11,354,056 B2 6/2022 Mittal et al.
11,416,395 B2 8/2022 Ray et al.
11,573,901 B2 2/2023 Ray et al.
11,669,260 B2 6/2023 Mittal et al.
11,706,317 B2 7/2023 Maharana et al.
11,740,793 B2 8/2023 Frolikov et al.
11,977,787 B2 5/2024 Maharana et al.
2002/0145919 A1 10/2002 Lamb et al.
2002/0196659 A1 12/2002 Hurst et al.
2003/0126232 A1 7/2003 Mogul et al.
2004/0186960 A1 9/2004 Poggio
2006/0087893 A1 4/2006 Nishihara et al.
2006/0095676 A1 5/2006 Dzierzon et al.
2006/0095679 A1 5/2006 Edirisooriya
2006/0206658 A1 9/2006 Hendel et al.
2007/0033367 A1 2/2007 Sakarda et al.
2007/0074093 A1 3/2007 Lasser
2007/0112864 A1 5/2007 Ben-natan
2007/0239977 A1 10/2007 Wu
2008/0016297 A1 1/2008 Bartley et al.
2008/0215826 A1 9/2008 Markova et al.
2008/0244218 A1 10/2008 Dzierzon et al.
2008/0276038 A1 11/2008 Tanaka et al.
2009/0037941 A1 2/2009 Armstrong et al.
2009/0113422 A1 4/2009 Kani
2009/0150639 A1 6/2009 Ohata
2009/0199190 A1 8/2009 Chen et al.
2009/0248957 A1 10/2009 Tzeng
2010/0005217 A1 1/2010 Jeddeloh
2010/0011169 A1 1/2010 Pothireddy
2010/0017650 A1 1/2010 Chin et al.
2010/0082899 A1 4/2010 Nakajima et al.
2010/0281230 A1 11/2010 Rabii et al.
2010/0293325 A1 11/2010 Maheshwari
2010/0293412 A1 11/2010 Sakaguchi et al.
2011/0161554 A1 6/2011 Selinger et al.
2011/0231857 A1 9/2011 Zaroo et al.
2011/0238887 A1 9/2011 Bazzani
2011/0238899 A1 9/2011 Yano et al.
2012/0041914 A1 2/2012 Tirunagari
2012/0047312 A1 2/2012 Nathuji et al.
2012/0054419 A1 3/2012 Chen et al.
2012/0079285 A1 3/2012 Gueron et al.
2012/0084497 A1 4/2012 Subramaniam et al.
2012/0117304 A1 5/2012 Worthington et al.
2012/0124572 A1 5/2012 Cunningham et al.
2012/0226850 A1 9/2012 Nakanishi
2012/0246403 A1 9/2012 Mchale et al.
2012/0297121 A1 11/2012 Gorobets et al.
2012/0297122 A1 11/2012 Gorobets et al.
2012/0323977 A1 12/2012 Fortier et al.
2013/0024609 A1 1/2013 Gorobets et al.
2013/0111113 A1 5/2013 Harari et al.
2013/0124811 A1 5/2013 Hamilton et al.
2013/0145095 A1 6/2013 McKean et al.
2013/0151761 A1 6/2013 Kim et al.
2013/0152086 A1 6/2013 Yoo et al.
2013/0179632 A1 7/2013 Ben-shemesh et al.
2013/0226837 A1 8/2013 Lymberopoulos et al.
2014/0006740 A1 1/2014 Tokusho et al.
2014/0013033 A1* 1/2014 Sharon ................ G11C 11/5628 711/103
2014/0032818 A1 1/2014 Chang et al.
2014/0040550 A1 2/2014 Bill et al.
2014/0089631 A1 3/2014 King
2014/0126274 A1 5/2014 Lee et al.
2014/0149985 A1* 5/2014 Takeuchi ............. G06F 9/4555 718/1
2014/0164676 A1 6/2014 Borchers et al.
2014/0164677 A1 6/2014 Borchers et al.
2014/0208042 A1 7/2014 Chinya et al.
2015/0016046 A1 1/2015 Shaeffer

(56) References Cited

U.S. PATENT DOCUMENTS

2015/0026509 A1 1/2015 Zhang et al.
2015/0032921 A1 1/2015 Malkin
2015/0067087 A1 3/2015 Guerin et al.
2015/0082062 A1 3/2015 Saraswat et al.
2015/0097851 A1 4/2015 Anderson et al.
2015/0106656 A1 4/2015 Bian et al.
2015/0134927 A1 5/2015 Varanasi
2015/0160858 A1 6/2015 Okada et al.
2015/0169238 A1 6/2015 Lee et al.
2015/0178013 A1 6/2015 Rostoker et al.
2015/0199276 A1 7/2015 Radhakrishnan et al.
2015/0212741 A1 7/2015 Lee et al.
2015/0227465 A1 8/2015 Sundaram et al.
2015/0268875 A1 9/2015 Jeddeloh
2015/0278091 A1 10/2015 Wilkerson et al.
2015/0356125 A1 12/2015 Golander et al.
2015/0378934 A1 12/2015 Nathan et al.
2016/0042005 A1 2/2016 Liu et al.
2016/0054922 A1 2/2016 Awasthi et al.
2016/0110291 A1 4/2016 Gordon et al.
2016/0125048 A1 5/2016 Hamada
2016/0152086 A1 6/2016 Kawakita
2016/0188218 A1 6/2016 Gray et al.
2016/0188700 A1 6/2016 Kleinschnitz, Jr. et al.
2016/0210167 A1 7/2016 Bolic et al.
2016/0210251 A1 7/2016 Nale et al.
2016/0210465 A1 7/2016 Craske et al.
2016/0212214 A1 7/2016 Rahman et al.
2016/0253263 A1 9/2016 Takada
2016/0283698 A1 9/2016 Huang et al.
2016/0294710 A1 10/2016 Sreeramoju
2016/0306557 A1 10/2016 Koseki et al.
2016/0328156 A1 11/2016 Swarbrick et al.
2016/0328334 A1 11/2016 Mese et al.
2016/0350236 A1 12/2016 Tsirkin et al.
2016/0371014 A1 12/2016 Roberts
2016/0371496 A1 12/2016 Sell
2017/0039164 A1 2/2017 Nikolas et al.
2017/0060754 A1 3/2017 Nakra et al.
2017/0060769 A1 3/2017 Wires et al.
2017/0123796 A1 5/2017 Kumar et al.
2017/0131902 A1 5/2017 Goss et al.
2017/0147427 A1 5/2017 Nero
2017/0177486 A1 6/2017 Horn
2017/0185523 A1 6/2017 Trika et al.
2017/0187621 A1 6/2017 Shalev et al.
2017/0199666 A1 7/2017 Sundaram et al.
2017/0249266 A1 8/2017 Nale et al.
2017/0255383 A1 9/2017 Chang et al.
2017/0262215 A1 9/2017 Banerjee et al.
2017/0285967 A1 10/2017 Pandurangan et al.
2017/0285992 A1 10/2017 Vogt
2017/0302734 A1 10/2017 Liang et al.
2017/0316321 A1 11/2017 Whitney et al.
2017/0364422 A1 12/2017 Antony et al.
2017/0364450 A1 12/2017 Struttmann
2018/0001790 A1 1/2018 Erbacher et al.
2018/0004441 A1 1/2018 Takamura et al.
2018/0011790 A1 1/2018 Gaur et al.
2018/0018379 A1 1/2018 Eda et al.
2018/0024853 A1 1/2018 Warfield et al.
2018/0046581 A1 2/2018 Banerjee et al.
2018/0059976 A1 3/2018 Helmick et al.
2018/0089087 A1 3/2018 Chang et al.
2018/0121366 A1 5/2018 Tian
2018/0150219 A1 5/2018 Chen et al.
2018/0189207 A1 7/2018 Nale et al.
2018/0260135 A1 9/2018 Hayashida et al.
2018/0260235 A1 9/2018 Hoppert et al.
2018/0293163 A1 10/2018 Bergeron
2018/0316569 A1 11/2018 Cilfone et al.
2018/0332366 A1 11/2018 Paduroiu
2019/0004841 A1 1/2019 Starks
2019/0018809 A1 1/2019 Nale et al.
2019/0034284 A1 1/2019 Mohanta et al.
2019/0079689 A1 3/2019 Cherubini et al.
2019/0102287 A1* 4/2019 Cayton ............... H04L 67/1097
2019/0129834 A1 5/2019 Purkayastha et al.
2019/0129847 A1 5/2019 Roh
2019/0179760 A1 6/2019 Bhargava et al.
2019/0196996 A1 6/2019 Balakrishnan et al.
2019/0243552 A1 8/2019 Maharana et al.
2019/0243570 A1 8/2019 Mittal et al.
2019/0243756 A1 8/2019 Ray et al.
2019/0243771 A1 8/2019 Mittal et al.
2019/0243787 A1 8/2019 Mittal et al.
2019/0253520 A1 8/2019 Maharana et al.
2019/0303283 A1 10/2019 Mcglaughlin et al.
2019/0310780 A1 10/2019 Gholamipour et al.
2019/0324690 A1 10/2019 Jin
2019/0332556 A1 10/2019 Nale et al.
2019/0334801 A1 10/2019 Dutta et al.
2019/0370043 A1 12/2019 Olderdissen
2020/0019506 A1 1/2020 Ray et al.
2020/0073827 A1 3/2020 Wallach
2020/0074094 A1 3/2020 Wallach
2020/0319813 A1 10/2020 Mittal et al.
2020/0326851 A1 10/2020 Frolikov et al.
2021/0034524 A1 2/2021 Leidel et al.
2021/0048947 A1 2/2021 Frolikov et al.
2021/0117326 A1 4/2021 Ray et al.
2021/0120099 A1 4/2021 Maharana et al.
2021/0349638 A1 11/2021 Maharana et al.
2022/0326868 A1 10/2022 Mittal et al.
2022/0398194 A1 12/2022 Ray et al.
2023/0362280 A1 11/2023 Maharana et al.
2023/0393743 A1 12/2023 Frolikov et al.

FOREIGN PATENT DOCUMENTS

KR 20140041408 4/2014
KR 20160116533 A 10/2016

OTHER PUBLICATIONS

Mmap, Wikipedia, printed on Apr. 18, 2018.
"Solid-State Drive", Wikipedia, printed on Mar. 14, 2018.
"Write combining," Wikipedia encyclopedia entry located at https://en.wikipedia.org/wiki/Write_combining, Feb. 12, 2018.
A. Romanow, J. Mogul, T. Talpey, S. Bailey, "Remote Direct Memory Access (RDMA) over IP Problem Statement", RFC 4297, Dec. 2005 (https://www.rfc-editor.org/search/rfc_search_detail.php).
Abhijith, et al. "The Efficient Use of Storage Resources in SAN for Storage Tiering and Caching," 2015 International Conference on Computational Intelligence and Networks, IEEE, Jan. 11, 2016.
Cong, Ming, et al., "Reducing Memory-access Latency of Block Execution Model Through Data Prefetching." Small Micro Computer Systems, Journal of Chinese Computer Systems, vol. 31, No. 8, Aug. 8, 2010.
Cai, "Error Characterization, Mitigation and Recovery", 2017.
Demand paging, Wikipedia, printed on Apr. 18, 2018.
Device driver, Wikipedia, printed on Apr. 19, 2018.
Extended European Search Report, EP19746665.9, mailed on May 3, 2021.
Extended European Search Report, EP19747107.1, mailed on Apr. 30, 2021.
Extended European Search Report, EP19746836.6, mailed on May 19, 2021.
Extended European Search Report, EP19748086.6, mailed on Jun. 8, 2021.
Extended European Search Report, EP19746972.9, mailed on May 19, 2021.
Extended European Search Report, EP19833924.4, mailed on Mar. 18, 2022.
Garbage collection (computer science), Wikipedia, printed on Sep. 26, 2018.
Graphics processing unit, Wikipedia, printed on Jul. 26, 2018.
Handy, Jim. "Where does NVRAM Fit?" Objective Analysis, Aug. 15, 2014.

(56) References Cited

OTHER PUBLICATIONS

Hypervisor, Wikipedia, printed on Apr. 19, 2018.
InfiniBand, Wikipedia, printed on Jul. 26, 2018.
Integrated circuit, Wikipedia, printed on Sep. 24, 2018.
Interlaken (networking), Wikipedia, printed on Sep. 21, 2018.
International Search Report and Written Opinion, PCT/US2019/013841, Apr. 23, 2019.
International Search Report and Written Opinion, PCT/US2019/013836, Apr. 22, 2019.
International Search Report and Written Opinion, PCT/US2019/015602, mailed May 3, 2019.
International Search Report and Written Opinion, PCT/US2019/014205, mailed May 1, 2019.
International Search Report and Written Opinion, PCT/US2019/014285, mailed May 8, 2019.
International Search Report, PCT/US2019/040413, mailed Oct. 25, 2019.
International Search Report and Written Opinion, PCT/US2019/014275, mailed May 8, 2019.
International Search Report and Written Opinion, PCT/US2020/021825, mailed Jul. 6, 2020.
Jacob, et al. "Optimized utilization of disks in storage area network by storage tiering," 2017 International Conference on Computing, Communication, and Automation 9ICCCA), IEEE, May 5, 2017.
Jeff Hawkins et al., "Sequence memory for prediction, inference and behaviour", In: Philosophical Transactions of the Royal Society B: Biological Sciences, pp. 1203-1209, May 1, 2009.
Kalnoskas, Aimee. "SSD controllers integrate DDR4 DRAM on chip." Microsemi, Aug. 5, 2016.
Message Passing Interface, Wikipedia, printed on Jul. 26, 2018.
Microsequencer, Wikipedia, printed on Sep. 21, 2018.
Oracle, "NFS Over ROMA", Retrieved on Feb. 18, 2020 from https://web.archive.org/web/20150920225910/https://docs.oracle.com/cd/E23824_01/html/821-1454/rfsrefer-154.html# (Year: 2015).
Operating system, Wikipedia, printed on Apr. 18, 2018.
Oracle Solaris Administration, "NFS Over RDMA." Retrieved from the Internet <https://web.archive.org/web/20150920225910/https://docs.oracle.com/cd/E23824_01/html/821-1454/rfsrefer-154.html#> on Mar. 9, 2023.
PCI Express, Wikipedia, printed on Sep. 21, 2018.
Page cache, Wikipedia, printed on Apr. 18, 2018.
Page replacement algorithm, Wikipedia, printed on Jul. 31, 2018.
Page table, Wikipedia, printed on Jul. 31, 2018.
Paging, Wikipedia, printed on Apr. 18, 2018.
Palmer, Mark, et al. "Fido: A Cache That Learns to Fetch." Proceedings of the 17th International Conference on Very Large Data Bases, Sep. 1991.
Ppeled, Leeor, et al. "A neural network memory prefetcher using semantic locality." arXiv:1804.00478v2, Jul. 26, 2018.
RAM drive, Wikipedia, printed on Apr. 18, 2018.
Salkhordeh, Reza, et al., "Operating System Level Data Tiering Using Online Workload Characterization." Journal of Supercomputing, vol. 71 No. 4, Jan. 31, 2015.
Salkhordeh, Reza, et al., "Operating system level data tiering using online workload characterization." Springer Science + Business Media, 2015.
Salkhordeh, et al. "Operating system level data tiering using online workload characterization," Journal of Supercomputing, Kluwer Academic Publishers, Jan. 31, 2015.
SerDes, Wikipedia, printed on Sep. 21, 2018.
Switched fabric, Wikipedia, printed on Jul. 26, 2018.

* cited by examiner

REMOTE DIRECT MEMORY ACCESS IN MULTI-TIER MEMORY SYSTEMS

RELATED APPLICATIONS

The present application is a continuation application of U.S. patent application Ser. No. 17/382,200 filed Jul. 21, 2021 and issued as U.S. Pat. No. 11,977,787 on May 7, 2024, which is a continuation application of U.S. patent application Ser. No. 16/107,624 filed Aug. 21, 2018 and issued as U.S. Pat. No. 11,099,789 on Aug. 24, 2021, which claims priority to Prov. U.S. patent application Ser. No. 62/626,523 filed Feb. 5, 2018, the entire disclosures of which applications are hereby incorporated herein by reference.

The present application relates to U.S. patent application Ser. No. 16/032,331, filed Jul. 11, 2018, issued as U.S. Pat. No. 10,877,892 on Dec. 29, 2020, and entitled "Predictive Paging to Accelerate Memory Access," U.S. patent application Ser. No. 16/035,469, filed Jul. 13, 2018, issued as U.S. Pat. No. 10,691,611 on Jun. 23, 2020 and entitled "Isolated Performance Domains in a Memory System," U.S. patent application Ser. No. 16/054,719, filed Aug. 3, 2018, issued as U.S. Pat. No. 11,416,395 on Aug. 16, 2022 and entitled "Memory Virtualization for Accessing Heterogeneous Memory Components," U.S. patent application Ser. No. 16/054,819, filed Aug. 3, 2018, issued as U.S. Pat. No. 10,782,908 on Sep. 22, 2020 and entitled "Predictive Data Orchestration in Multi-Tier Memory Systems," and U.S. patent application Ser. No. 16/054,890, filed Aug. 3, 2018, issued as U.S. Pat. No. 10,671,460 on Jun. 2, 2020, and entitled "Memory Access Communications through Message Passing Interface Implemented in Memory Systems," the entire disclosures of which applications are hereby incorporated herein by reference.

TECHNICAL FIELD

At least some embodiments disclosed herein relate to memory systems in general, and more particularly, but not limited to remote direct memory access (RDMA) in multi-tier memory systems.

BACKGROUND

A memory sub-system can be a memory module, such as a dual in-line memory module (DIMM), a small outline DIMM (SO-DIMM), or a non-volatile dual in-line memory module (NVDIMM). A memory sub-system can be a storage system, such as a solid-state drive (SSD), or a hard disk drive (HDD). A memory sub-system can include one or more memory components that store data. The memory components can be, for example, non-volatile memory components and volatile memory components. Examples of memory components include memory integrated circuits. Some memory integrated circuits are volatile and require power to maintain stored data. Some memory integrated circuits are non-volatile and can retain stored data even when not powered. Examples of non-volatile memory include flash memory, read-only memory (ROM), programmable read-only memory (PROM), erasable programmable read-only memory (EPROM) and electronically erasable programmable read-only memory (EEPROM) memory, etc. Examples of volatile memory include dynamic random-access memory (DRAM) and static random-access memory (SRAM). In general, a host system can utilize a memory sub-system to store data at the memory components and to retrieve data from the memory components.

For example, a computer can include a host system and one or more memory sub-systems attached to the host system. The host system can have a central processing unit (CPU) in communication with the one or more memory sub-systems to store and/or retrieve data and instructions. Instructions for a computer can include operating systems, device drivers, and application programs. An operating system manages resources in the computer and provides common services for application programs, such as memory allocation and time sharing of the resources. A device driver operates or controls a particular type of devices in the computer; and the operating system uses the device driver to offer resources and/or services provided by the type of devices. A central processing unit (CPU) of a computer system can run an operating system and device drivers to provide the services and/or resources to application programs. The central processing unit (CPU) can run an application program that uses the services and/or resources. For example, an application program implementing a type of applications of computer systems can instruct the central processing unit (CPU) to store data in the memory components of a memory sub-system and retrieve data from the memory components.

An operating system of a computer system can allow an application program to use virtual addresses of memory to store data in, or retrieve data from, memory components of one or more memory sub-systems of the computer system. The operating system maps the virtual addresses to physical addresses of one or more memory sub-systems connected to the central processing unit (CPU) of the computer system. The operating system implements the memory accesses specified at virtual addresses using the physical addresses of the memory sub-systems.

A virtual address space can be divided into pages. A page of virtual memory can be mapped to a page of physical memory in the memory sub-systems. The operating system can use a paging technique to access a page of memory in a storage device via a page of memory in a memory module. At different time instances, the same page of memory in a memory module can be used as proxy to access different pages of memory in the storage device or another storage device in the computer system.

A computer system can include a hypervisor (or virtual machine monitor) to create or provision virtual machines. A virtual machine is a computing device that is virtually implemented using the resources and services available in the computer system. The hypervisor presents the virtual machine to an operating system as if the components of virtual machine were dedicated physical components. A guest operating system runs in the virtual machine to manage resources and services available in the virtual machine, in a way similar to the host operating system running in the computer system. The hypervisor allows multiple virtual machines to share the resources of the computer system and allows the virtual machines to operate on the computer substantially independently from each other.

Remote direct memory access (RDMA) is technique for a direct memory access from the memory of one computer into the memory of another over a computer network without involving the operating systems of the computers. A network adapter is used to transfer data directly to or from application without the need to copy data between application memory and data buffers in the operating systems of the computer. Thus, RDMA operations can be performed in parallel with other system operations without involving the central processing units (CPUs) of the computers.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
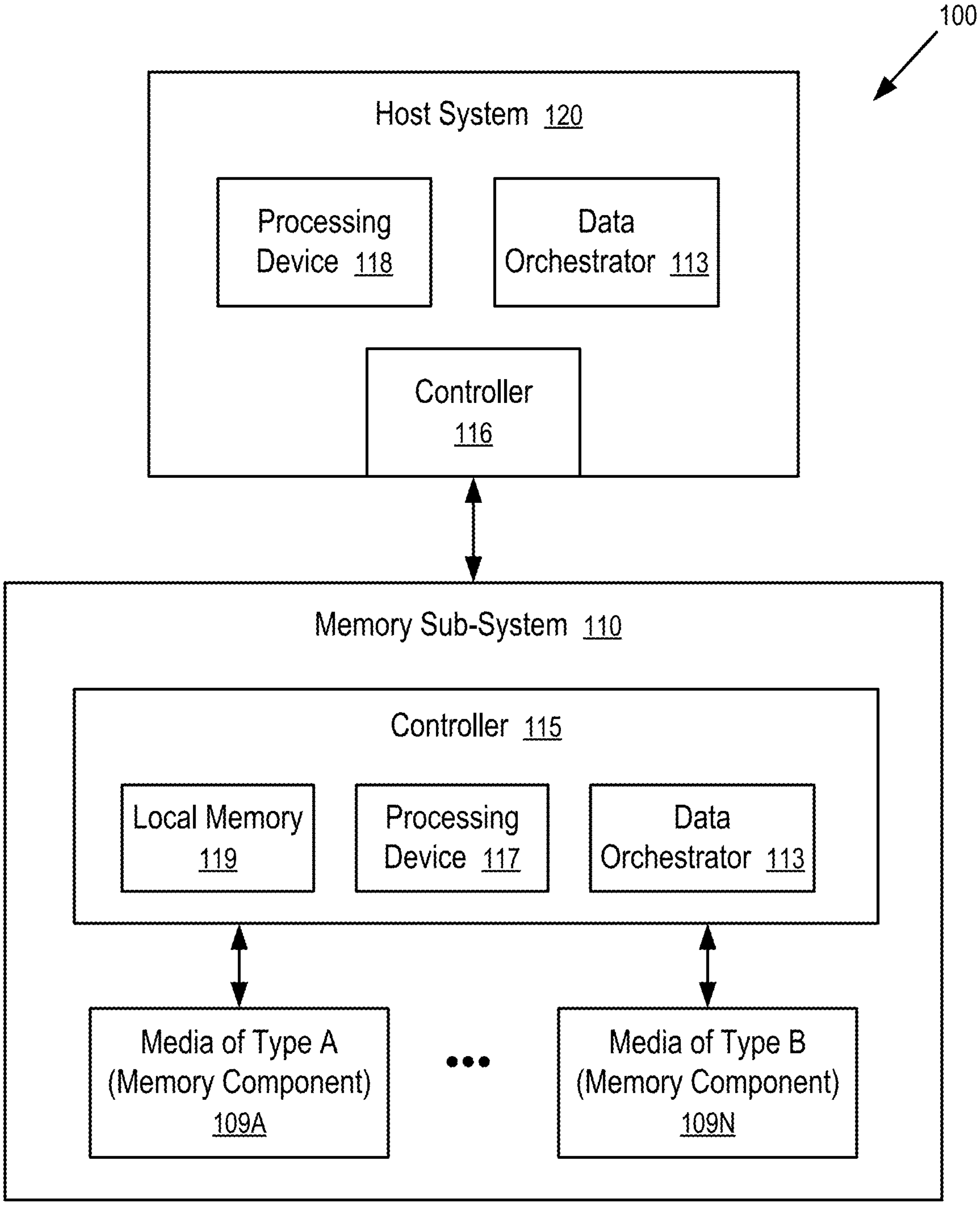
FIG. 1 illustrates an example computing system having a memory sub-system in accordance with some embodiments of the present disclosure.

At least some aspects of the present disclosure are directed to remote direct memory access techniques in a multi-tier memory sub-system having an intelligent data orchestrator. A memory sub-system is also hereinafter referred to as a "memory device." An example of a memory sub-system is a memory module that is connected to a central processing unit (CPU) via a memory bus. Examples of memory modules include a dual in-line memory module (DIMM), a small outline DIMM (SO-DIMM), a non-volatile dual in-line memory module (NVDIMM), etc. Another example of a memory sub-system is a storage device that is connected to the central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). In some embodiments, the memory sub-system is a hybrid memory/storage sub-system that provides both memory functions and storage functions. In general, a host system can utilize a memory sub-system that includes one or more memory components. The host system can provide data to be stored at the memory sub-system and can request data to be retrieved from the memory sub-system.

A conventional system can have a cache structure where slower memories are accessed through faster memories. When a processor accesses data that is currently in a slower memory, the data is loaded to a faster memory as a proxy of the data in the slower memory. Subsequently, the processor operates on the proxy/cache of the data in the faster memory for improved performance. The faster memory typically has a capacity smaller than the slower memory. Thus, only a portion of the data in the slower memory can be cached concurrently in the faster memory. A cache miss occurs when an item accessed by the processor is not currently in the faster memory. A cache hit occurs when an item accessed by the processor is currently in the faster memory. The percentage of accesses that result in cache hits is a cache hit ratio. Improving the cache hit ratio can improve the operating performance of the computing system. However, it is a challenge to design a cache policy to improve cache hit ratio.

At least some aspects of the present disclosure address the above and other deficiencies by performing predictive data movements across different tiers of memories using a machine learning technique. Memories of different tiers can have different data access speeds. For example, to improve operating performance of a computing system, frequently used data can be placed in a faster memory; and less frequently used data can be placed in a slower memory. The faster memory can be optionally configured as a cache memory for the slower memory. In some instances, at least a portion of the slower memory can be accessed directly without going through the faster memory as a cache. Data usage information can be applied in a predictive model, trained using a machine learning technique, to predict workload intend and thus data movements across the memories of different tiers. For example, data usage information can include the history of data accesses and attributes related to data accesses, such as applications or programs that uses the data, user accounts in which the data accesses are made, virtual machines that access the data, objects to which the data belong, mapping between data blocks to objects as organized in applications, relations among objects, etc. The data movements predicted according to the data usage information can be performed preemptively to improve the operating performance of the computing system. The prediction model can be initially trained offline using historic data usage information and historic data movements caused by data accesses associated with the data usage information. The training minimizes the differences between the historic data movements and predictions generated by applying the historic data usage information in the prediction model. Subsequently, the prediction model can be used for real time prediction using the real time data usage information. Performing the predicted data movements can reduce the need to move data in response to data access requests. The data movements caused by the real time data access requests, and/or indications of whether the predicted data movements reduce the need to move data across the tires, can be used to identify desired real time prediction results. The desired results can further train the prediction model using a reinforcement machine learning technique for continued improvement and adaptation of the prediction model. The prediction model can be dynamically adapted to the current workloads in real time usage of the computing system.

Predictive data movements may interfere with remote direct memory access operations. For example, when a remote direct memory access operation is performed on a page of memory in a way independent of the operating system, a predictive data movement involving the page of memory can cause erroneous results. To avoid erroneous results the operating system can be configured to coordinate with predictive data movements such that, during the remote direct memory access operation, predictive data movements are not performed on the page of memory that is involved in the remote direct memory access operation. For example, before the onset of the remote direct memory access operation, the page of virtual memory involving the remote direct memory access operation can be pinned to physical memory or configured to be paged on demand; and after the completion of the remote direct memory access operation, the page of virtual memory can be reconfigured to allow predictive data movements.

FIG. 1 illustrates an example computing system 100 having a memory sub-system 110 in accordance with some embodiments of the present disclosure. The memory sub-system 110 can include media, such as memory components 109A to 109N. The memory components 109A to 109N can be volatile memory components, non-volatile memory components, or a combination of such. In some embodiments, the memory sub-system 110 is a memory module. Examples of a memory module includes a DIMM, NVDIMM, and NVDIMM-P. In some embodiments, the memory sub-system is a storage system. An example of a storage system is an SSD. In some embodiments, the memory sub-system 110 is a hybrid memory/storage sub-system. In general, the computing environment can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, fibre channel, serial attached SCSI (SAS), a double data rate (DDR) memory bus, etc. The physical host interface can be used to transmit data between the host system 120 and the memory sub-system 110. The host system 120 can further utilize an NVM express (NVMe) interface to access the memory components 109A to 109N when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The host system 120 includes a processing device 118 and a controller 116. The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110.

In general, the controller 116 can send commands or requests to the memory sub-system 110 for desired access to memory components 109A to 109N. The controller 116 can further include interface circuitry to communicate with the memory sub-system 110. The interface circuitry can convert responses received from the memory sub-system 110 into information for the host system 120.

The controller 116 of the host system 120 can communicate with the controller 115 of the memory sub-system 110 to perform operations such as reading data, writing data, or erasing data at the memory components 109A to 109N and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory components 109A to 109N can include any combination of the different types of non-volatile memory components and/or volatile memory components. An example of non-volatile memory components includes a negative-and (NAND) type flash memory. Each of the memory components 109A to 109N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and an MLC portion of memory cells. Each of the memory cells can store one or more bits of data (e.g., data blocks) used by the host system 120. Although non-volatile memory components such as NAND type flash memory are described, the memory components 109A to 109N can be based on any other type of memory such as a volatile memory. In some embodiments, the memory components 109A to 109N can be, but are not limited to, random access memory (RAM), read-only memory (ROM), dynamic random access memory (DRAM), synchronous dynamic random access memory (SDRAM), phase change memory (PCM), magneto random access memory (MRAM), spin transfer torque (STT)-MRAM, ferroelectric random-access memory (FeTRAM), ferroelectric RAM (FeRAM), conductive bridging RAM (CBRAM), resistive random access memory (RRAM), oxide based RRAM (OxRAM), negative-or (NOR) flash memory, electrically erasable programmable read-only memory (EEPROM), nanowire-based non-volatile memory, memory that incorporates memristor technology, and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 109A to 109N can be grouped as memory pages or data blocks that can refer to a unit of the memory component used to store data.

The controller 115 of the memory sub-system 110 can communicate with the memory components 109A to 109N to perform operations such as reading data, writing data, or erasing data at the memory components 109A to 109N and other such operations (e.g., in response to commands scheduled on a command bus by controller 116). The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processing device 117 (processor) configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 109A to 109N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 109A to 109N. The controller 115 can further include host interface circuitry to communicate with the host system 120 via the physical host interface. The host interface circuitry can convert the commands received from the host system into command instructions to access the memory components 109A to 109N as well as convert responses associated with the memory components 109A to 109N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 109A to 109N.

The computing system 100 includes a data orchestrator 113 in the memory sub-system 110 that can perform predictive data movements between faster memory (e.g., 109A) and slower memory (e.g., 109N) of the memory sub-system 110. The computing system 100 further includes a data orchestrator 113 in the host system 120 that coordinates with the data orchestrator 113 in the memory sub-system 110 to at least facilitate remote direct memory access operations. In some embodiments, the controller 115 in the memory sub-system 110 includes at least a portion of the data orchestrator 113 in the memory sub-system 110. In other embodiments, or in combination, the controller 116 and/or the processing device 118 in the host system 120 includes at least a portion of the data orchestrator 113 in the host system 120. For example, the controller 115, the controller 116, and/or the processing device 118 can include logic circuitry implementing the data orchestrators 113. For example, the controller 115, or the processing device 118 (processor) of the host system 120, can be configured to execute instructions stored in memory for performing the operations of the data orchestrator 113 in the host system 120 described herein. In some embodiments, the data orchestrator 113 in the memory sub-system 110 is implemented in an integrated circuit chip disposed in the memory sub-system 110. In other embodiments, the data orchestrator 113 in the host system 120 is part of an operating system of the host system 120, a device driver, or an application.

The data orchestrator 113 in the memory sub-system 110 can predict data usages and data movements in the computing system 100, including data movements within the memory sub-system 110. For the duration of a remote direct access operation, the data orchestrator 113 in the host system 120 prevents the data orchestrator 113 in the memory sub-system 110 from swapping out the page of memory that is used in the remote direct access operation. After the remote direct access operation is initiated, the data transfer made in the remote direct access operation can be performed without involvement of the processing device 118 and/or without involvement of the host system 120; and the coordination between the data orchestrators 113 ensures that the data transfer of the remote direct memory access is not effected by the concurrent predictive data movements performed by the data orchestrator 113 in the memory sub-system 110 and/or the operations in the host system 120. Further details with regards to the operations of the data orchestrators 113 are described below.

Figure 2:
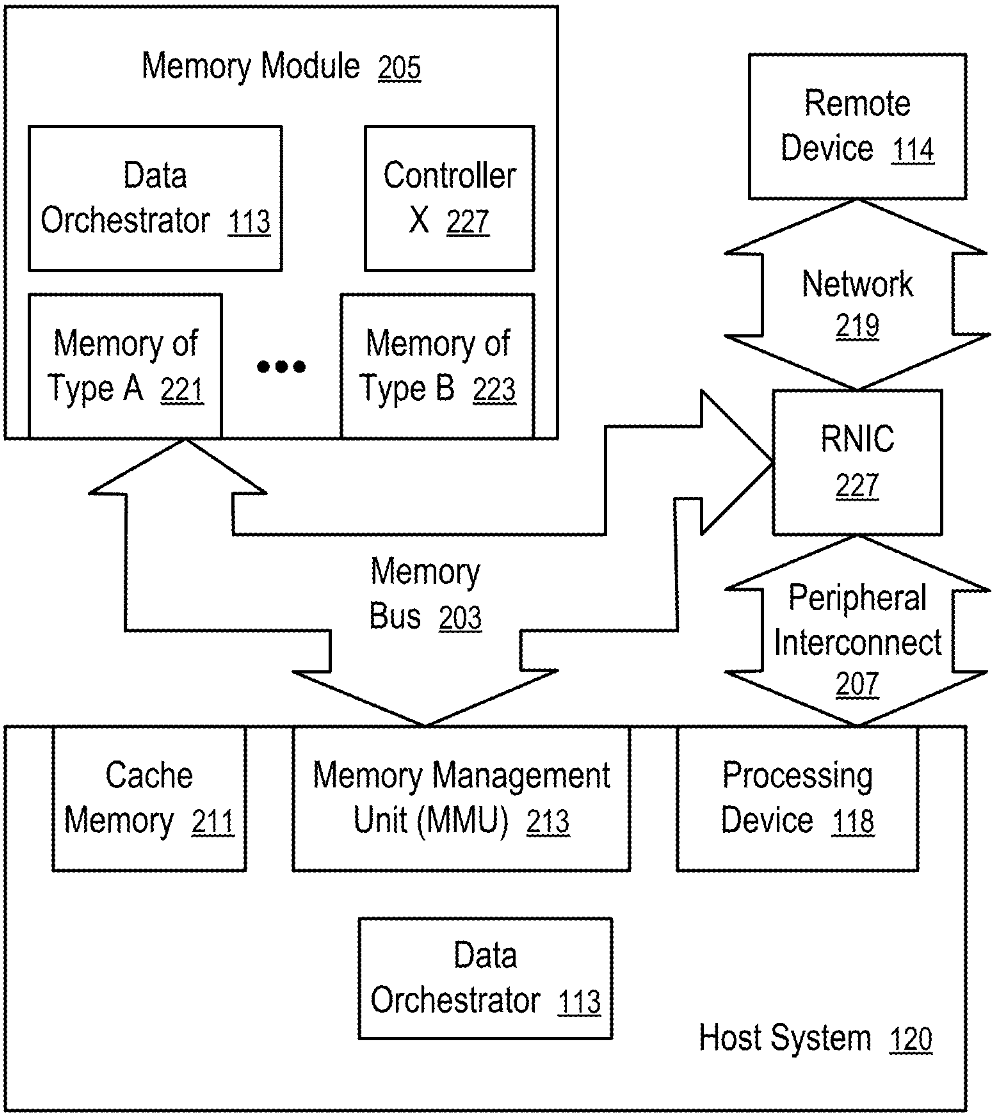
FIG. 2 shows a computing system having data orchestrators to facilitate remote direct memory access in accordance with at least some embodiments disclosed herein.

FIG. 2 shows a computing system having data orchestrators 113 to facilitate remote direct memory access in accordance with at least some embodiments disclosed herein.

The computing system of FIG. 2 includes a host system 120, a memory module 205 connected to the host system 120 via a memory bus 203, and a remote device 114 connected to a remote direct memory access (RDMA) network interface card (RNIC) 227 via a computer network 219. The RNIC 227 is connected to the memory module 205 via the memory bus 203 and connected to the host system 120 via a peripheral interconnect 207. The connections allow the RNIC 227 to receive a remote direct memory access (RDMA) command from the host system 120. In response to the command, the RNIC 227 can perform data transfer between the remote device 114 and the memory module 205 independent of the host system 120, such that during the RDMA operation, the host system 120 can perform other operations in parallel.

The memory module 205 is an example of the memory sub-system 110 illustrated in FIG. 1. The remote device 114 can be a computer system similar to that illustrated in FIG. 1. The remote device 114 can have its RNIC connected to the network 219, to a separate host system (e.g., similar to the host system 120 in FIG. 2), and to a separate memory module (e.g., similar to the memory module 205 in FIG. 2).

The host system 120 has a processing device 118, which can be a central processing unit or a microprocessor with one or more processing cores. The host system 120 can have a memory management unit 213 and cache memory 211. The memory management unit 213 and/or at least a portion of the cache memory 211 can be optionally integrated within the same integrated circuit package of the processing device 118.

The memory module 205 illustrated in FIG. 2 has multiple types of memories (e.g., 221 and 223). For example, memory of type A 221 is faster than memory of type B 223.

For example, the memory bus 203 can be a double data rate bus; and the peripheral interconnect 207 can be a peripheral component interconnect express (PCIe) bus, a serial advanced technology attachment (SATA) bus, a universal serial bus (USB) bus, and/or a storage area network. Memory of type B 223 in the memory module 205 can be accessed at a speed faster than accessing memory of type B 223 in the storage device 209.

In general, multiple memory modules (e.g., 205) can be coupled to the memory bus 203; and multiple storage devices (e.g., 209 illustrated in FIGS. 6 and 7) can be coupled to the peripheral interconnect 207. In some instances, the peripheral interconnect 207 and the storage devices (e.g., 209) are optional and can be absent from the computing system. In other instances, the memory bus 203 and the memory modules (e.g., 205) can be optional and can be absent from the computing system.

In a possible configuration when multiple memory modules (e.g., 205) are coupled to the memory bus 203, one of the memory modules (e.g., 205) has memory of type A 221; and another of the memory modules has memory of type B 223 that is accessible at a speed lower than the memory of type A 221 in a separate memory module (e.g., 205).

The processing device 118 and/or the MMU 213 are configured via instructions (e.g., an operating system and/or one or more device drivers) to access a portion of memory in the computer system via another portion of memory in the computer system using a paging technique and/or a memory map interface.

For example, memory of type B 223 of the memory module 205 can be accessed via memory of type A 221 of the memory module 205 (or another memory module).

For example, memory in a storage device (e.g., 209) can be accessed via memory of type A 221 of the memory module 205 and/or via memory of type B 223 of the memory module 205.

For example, in some instances, memory of type A 221 and memory of type B 223 in the same memory module 205 (or different memory modules) are addressable directly and separately over the memory bus 203 by the memory management unit 213 of the processing device 118. However, since the memory of type B 223 is slower than memory of type A 221, it is desirable to access the memory of type B 223 via the memory of type A 221.

In other instances, memory of type B 223 of the memory module 205 is accessible only through addressing the memory of type A 221 of the memory module 205 (e.g., due to the size restriction in the address portion of the memory bus 203).

The data orchestrator 113 can dynamically adjust the storage locations of data across different memories (e.g., 221, . . . , 223) to optimize the operating performance of the computing system. For example, frequently access data can be swapped to a faster memory (e.g., 221); and data that have not been used for a period of time can be swapped to a slower memory (e.g., 223). For example, the data orchestrator 113 can predict data movements using an artificial neural network and carry out the data movements across tiers of memories such that data accessed frequently in a subsequent time period is already in the faster memory (e.g., 221) before the data is accessed (or accessed frequently), as discussed below in connection with FIGS. 6-9. Some examples and details of predictive data movements can be found in U.S. patent application Ser. No. 16/054,819, filed Aug. 3, 2018 and entitled "Predictive Data Orchestration in Multi-Tier Memory Systems."

In FIG. 2, the data orchestrator 113 in the memory module 205 and the data orchestrator 113 in the host system 120 coordinate with each other to prevent from interfering with the operations of the RNIC 227. For example, when a page of virtual memory is allocated for a remote direct memory access (RDMA) operation, the data orchestrators 113 can cause the page to be pinned in the faster memory 221 (or the slower memory 223) until the RDMA operation is complete. Alternatively, when a page of virtual memory is allocated for a remote direct memory access (RDMA) operation, the data orchestrators 113 can configure the paging of the page out of the faster memory 221 (or the slower memory 223) to be performed on demand until the RDMA operation is complete. After the RDMA operation is complete, the configuration of the page of virtual memory can be adjusted to allow predictive data movements where the page can be moved from the faster memory 221 to the slower memory 223 (or from the slower memory 223 to the faster memory 221) based on workload predictions made using an artificial neural network.

When a page of virtual memory is configured as being pinned, the allocation of a page of physical memory in the memory module 205 corresponding to the page of virtual memory is not allowed to be changed by the operating system running in the host system 120 and/or by the data orchestrator 113 in the memory module 205. Since the mapping between the pinned page of virtual memory and the corresponding page in the memory module 205 cannot be changed while the page is configured as being pinned, the RNIC 227 can perform a RDMA operation on the corresponding page in the memory module 205 without involvement of the operating system and/or the host system 120.

Similarly, when a page of virtual memory is configured for paging on demand, the allocation of a page of physical memory in the memory module 205 is not allowed to be changed without an explicit request from the operating system running in the host system 120. Thus, while the page is configured for paging on demand, the mapping between the paging-on-demand page of virtual memory and the corresponding page in the memory module 205 cannot be changed by the data orchestrator 113 without an explicit request from the operating system. Thus, if the operating system is programmed to avoid issuing a paging request for the page during the pendency of the RDMA operation, the RNIC 227 can perform a RDMA operation on the corresponding page in the memory module 205 without involvement of the operating system and/or the host system 120.

The data orchestrator 113 can be configured to monitor the indication of the completion of the RDMA operation. Upon the completion of the RDMA operation, the data orchestrator 113 can adjust the setting of the page of virtual memory to allow the data orchestrator 113 in the memory module 205 to perform intelligent paging for the page of virtual memory (e.g., based on workload predictions).

The data orchestrator 113 can instruct a controller X 227 in the memory module 205 to perform data transfer/movement between the memory of type A 221 and the memory of type B 223 within the memory module 205 for a page of virtual memory allocated in the host system 120. During the operation of a RDMA operation performed by the RNIC 227, a page that is being operated upon is locked to prevent such data movements (e.g., locked via pinning or requiring paging on demand). After the operation of a RDMA data transfer performed by the RNIC 227, the page that has completed the RDMA data transfer is unlocked to allow data movements between the memory of type A 221 and the memory of type B 223.

In some instances, both the memory of type A 221 and the memory of type B 223 are accessible to the RNIC 227 via the memory bus 203; and the data orchestrator 113 are configured to lock the mapping of the page of virtual memory to a page in the memory of type A 221 or the memory of type B 223, selected to match with the performance level of the RDMA data transfer.

For example, when the speed of the slower memory of type B 223 is sufficient to accommodate the RDMA data transfer, the data orchestrator 113 can lock the page of virtual memory being operated upon for the RDMA data transfer to the slower memory of type B 223, instead of locking it to the faster memory of type A 221. Further, upon completion of the RDMA operation, the data orchestrator 113 can unlock the paging of the virtual memory page and move it to the faster memory of type A 221.

The computing system of FIG. 2 can be used to implement a desktop computer, laptop computer, network server, mobile device, or such computing device that includes a memory and a processing device. The processing device 118 can read data from or write data to the memory sub-systems (e.g., 205).

The processing device 118 can be coupled to a memory sub-system (e.g., 205) via one or more physical interface (e.g., 203, 207).

As used herein, "coupled to" generally refers to a connection between components, which can be an indirect communicative connection or direct communicative connection (e.g., without intervening components), whether wired or wireless, including connections such as, electrical, optical, magnetic, etc.

Examples of a physical host interface include, but are not limited to, a serial advanced technology attachment (SATA) interface, a peripheral component interconnect express (PCIe) interface, universal serial bus (USB) interface, fibre channel, small computer system interface (SCSI), serial attached SCSI (SAS), etc.

The physical host interface can be used to transmit data between the processing device 118 and the memory sub-system (e.g., 209). The computer system can further utilize an NVM express (NVMe) interface to access the memory (e.g., 223, . . . , 225) when the memory sub-system 209 is coupled with the peripheral interconnect 207 via the PCIe interface. The physical host interface can provide an interface for passing control, address, data, and other signals between the memory sub-system (e.g., 209) and the processing device 118.

In general, a memory sub-system (e.g., 205) includes a printed circuit board that connects a set of memory devices, such as memory integrated circuits, that provides the memory (e.g., 221, . . . , 223). The memory (e.g., 221, . . . , 223) on the memory sub-system (e.g., 205) can include any combination of the different types of non-volatile memory devices and/or volatile memory devices.

An example of non-volatile memory devices includes a negative-and (NAND) type flash memory or a negative-or (NOR) type flash memory. A memory integrated circuit can include one or more arrays of memory cells, such as single level cells (SLCs), multi-level cells (MLCs), triple level cells (TLCs), quad-level cells (QLCs), etc. In some implementations, a particular memory device can include both an SLC portion and an MLC (or TLC or QLC) portion of memory cells. Each of the memory cells can store one or more bits of data used by the host system 120. Although non-volatile memory devices such as NAND type flash memory are described, the memory integrated circuits can be based on any other type of memory such as a volatile memory. In some implementations, the memory (e.g., 221, . . . , 223, . . . , 225) can include, but are not limited to, random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EEPROM), and/or a cross-point array of non-volatile memory cells. A cross-point array of non-volatile memory can perform bit storage based on a change of bulk resistance, in conjunction with a stackable cross-gridded data access array. Additionally, in contrast to many flash-based memory, cross point non-volatile memory can perform a write in-place operation, where a non-volatile memory cell can be programmed without the non-volatile memory cell being previously erased. Furthermore, the memory cells of the memory devices can be grouped as memory pages or data blocks that can refer to a unit of the memory device used to store data.

A memory sub-system (e.g., 205) can have a controller (e.g., 227) that communicate with the memory (e.g., 221, . . . , 223) to perform operations such as reading data, writing data, or erasing data in the memory (e.g., 221, . . . , 223) and other such operations, in response to requests, commands or instructions from the processing device 118 and/or the memory management unit (MMU) 213. The controller (e.g., 227 or 229) can include hardware such as one or more integrated circuits and/or discrete components, a buffer memory, or a combination thereof. The controller (e.g., 227) can be a microcontroller, special purpose logic circuitry (e.g., a field programmable gate array (FPGA), an application specific integrated circuit (ASIC), etc.), or another suitable processor. The controller (e.g., 227) can include one or more processors (processing devices) configured to execute instructions stored in local memory.

The local memory of the controller (e.g., 227) can include an embedded memory configured to store instructions for performing various processes, operations, logic flows, and routines that control operation of the memory sub-system (e.g., 205, 209), including handling communications between the memory sub-system (e.g., 205) and the processing device 118/MMU 213, and other functions described in greater detail below. The local memory 119 of the controller (e.g., 227) can include read-only memory (ROM) for storing micro-code and/or memory registers storing, e.g., memory pointers, fetched data, etc.

While the example memory sub-systems (e.g., 205) in FIG. 2 have been illustrated as including controllers (e.g., 227), in another embodiment of the present disclosure, a memory sub-system (e.g., 205 or 209) may not include a controller (e.g., 227), and can instead rely upon external control (e.g., provided by the MMU 213, or by a processor or controller separate from the memory sub-system (e.g., 205 or 209)).

In general, the controller (e.g., 227) can receive commands, requests or instructions from the processing device 118 or MMU 213 in accordance with a standard communication protocol for the communication channel (e.g., 203 or 207) and can convert the commands, requests or instructions in compliance with the standard protocol into detailed instructions or appropriate commands within the memory sub-system (e.g., 205) to achieve the desired access to the memory (e.g., 221, . . . , 223). For example, the controller (e.g., 227) can be responsible for operations such as wear leveling operations, garbage collection operations, error detection and error-correcting code (ECC) operations, encryption operations, caching operations, and address translations between a logical block address and a physical block address that are associated with the memory (e.g., 221, . . . , 223). The controller (e.g., 227) can further include host interface circuitry to communicate with the processing device 118 via the physical host interface. The host interface circuitry can convert the commands received from the processing device 118 into command instructions to access the memory devices (e.g., 221, . . . , 223) as well as convert responses associated with the memory devices (e.g., 221, . . . , 223) into information for the processing device 118.

The memory sub-system (e.g., 205) can also include additional circuitry or components that are not illustrated. In some implementations, the memory sub-system (e.g., 205) can include a cache or buffer (e.g., DRAM) and address circuitry (e.g., a row decoder and a column decoder) that can receive an address from the controller (e.g., 227) or the MMU 213 and decode the address to access the memory (e.g., 221, . . . , 223).

In one example, the interconnect 207, or the memory bus 203, has one or more connectors to provide the memory sub-system (e.g., 205) with power and/or communicate with the memory sub-system (e.g., 205) via a predetermined protocol; and the memory sub-system (e.g., 205) has one or more connectors to receive the power, data and commands from the processing device 118. For example, the connection between the connector on the interconnect 207 and the connector on a memory sub-system (e.g., 205) can utilize a PCIe bus or a SATA bus.

Figure 6:
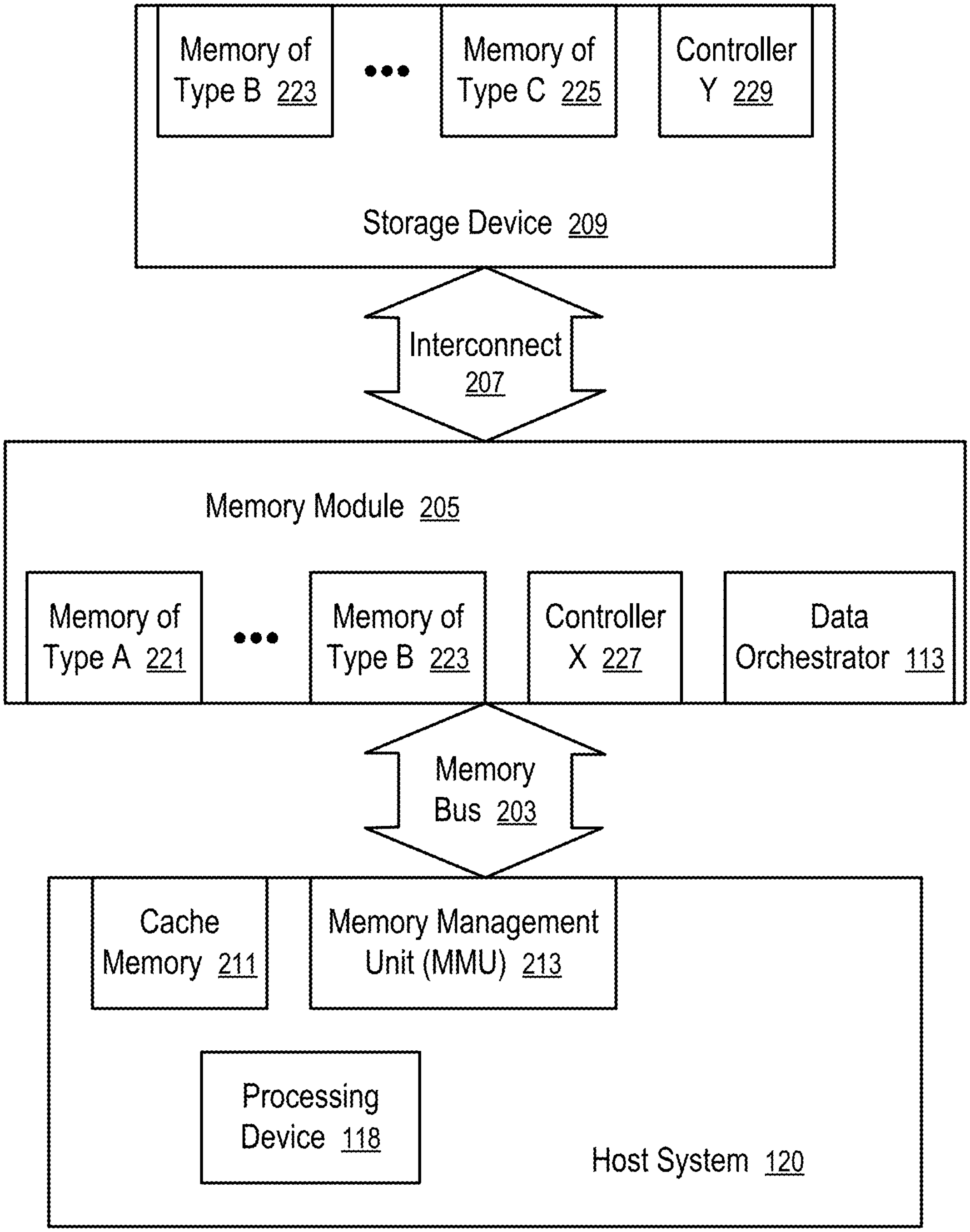
FIG. 6 shows a computing system having different tiers of memory and a data orchestrator to optimize data locations in accordance with at least some embodiments disclosed herein.

In some instances, the peripheral interconnect 207 can be connected to the host system 120 through the memory module 205 and/or the memory bus 203 (e.g., as illustrated in FIG. 6). In such a situation, the data orchestrator 113 can be implemented on the memory module 205, as illustrated in FIG. 6

In general, the processing device 118, the controller 227 and/or the data orchestrator 113 can execute one or more operating systems to provide services, including acceleration of memory access in which a portion of memory in the computer system is accessed via another portion of memory in the computer system using a paging technique and/or a memory map interface, as further discussed below.

Figure 3:
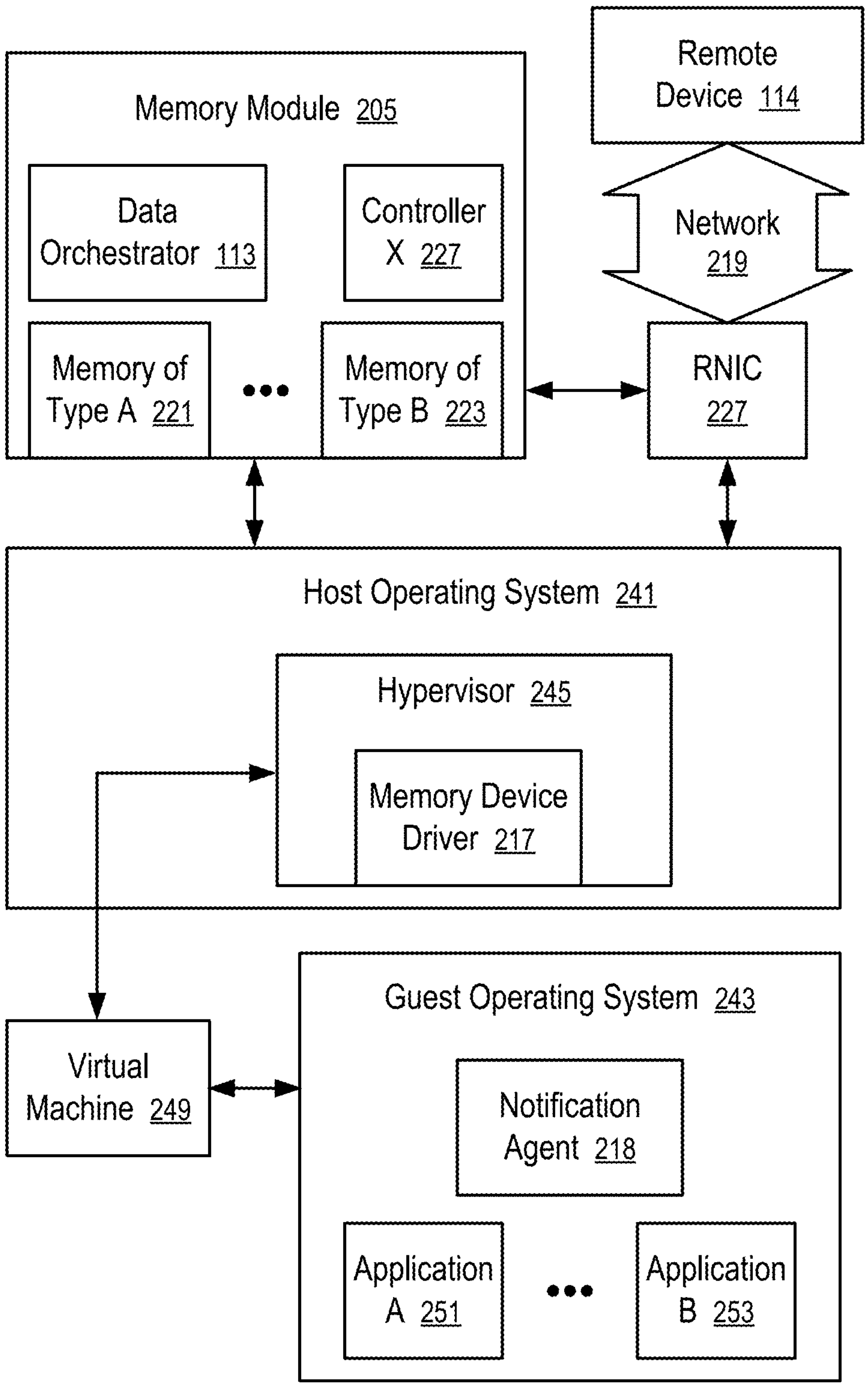
FIG. 3 shows a computing system to perform remote direct memory access according to one embodiment.

FIG. 3 shows a computing system to perform remote direct memory access according to one embodiment. For example, the system of FIG. 3 can be implemented using the computing system of FIG. 1 or 2.

In FIG. 3, the RNIC 227 can receive a command from the host operating system 241 to perform a remote direct memory access (RDMA) operation. The RDMA operation transfers a page of memory data between the memory module 205 and the remote device 114 over the network 219. For example, the network 219 can include a switched network fiber and/or another type of computer networks.

The host operating system 241 running in the host system 120 can include a hypervisor 245 that provides the memory resources and the RNIC 227 as virtual computer components of a virtual machine 249. The hypervisor 245 can allow a plurality of virtual machines (e.g., 249) to share the set of physical resources, such as the memory module 205 and the RNIC 227.

For example, the RNIC 227 can support single root input/output virtualization. The host operating system 241 can implement a device drive for the physical function of the RNIC 227; and a device drive in the virtual machine 249 can have a device drive for accessing a virtual function of the RNIC 227 corresponding to the physical function of the RNIC 227. Thus, different virtual functions of the RNIC 227 can be assigned to different virtual machines 249, as if multiple copies of the RNIC 227 were virtually present in the computer system to support the virtual machines (e.g., 249). A set of applications 251, . . . , 253 can run on top of the guest operating system 243 of the virtual machine 249.

In FIG. 3, a data orchestrator 113 in the host system 120 can include the memory device drive 217 and/or the notification agent 218. When an application 251 or 253 allocates a page of virtual memory for a RDMA operation, the notification agent 218 and/or the memory device driver 217 can lock the paging operations for the page. Thus, the mapping between the page of virtual memory and a page of memory 221 or 223 in the memory module 205 does not change during the RDMA operation. Upon detection of the completion of the RDMA data transfer between the memory module 205 and the remote device 114, the notification agent 218 and/or the memory device driver 217 can unlock the paging operations for the page such that the data orchestrator 113 can perform predictive data movements based on workloads.

Figure 4:
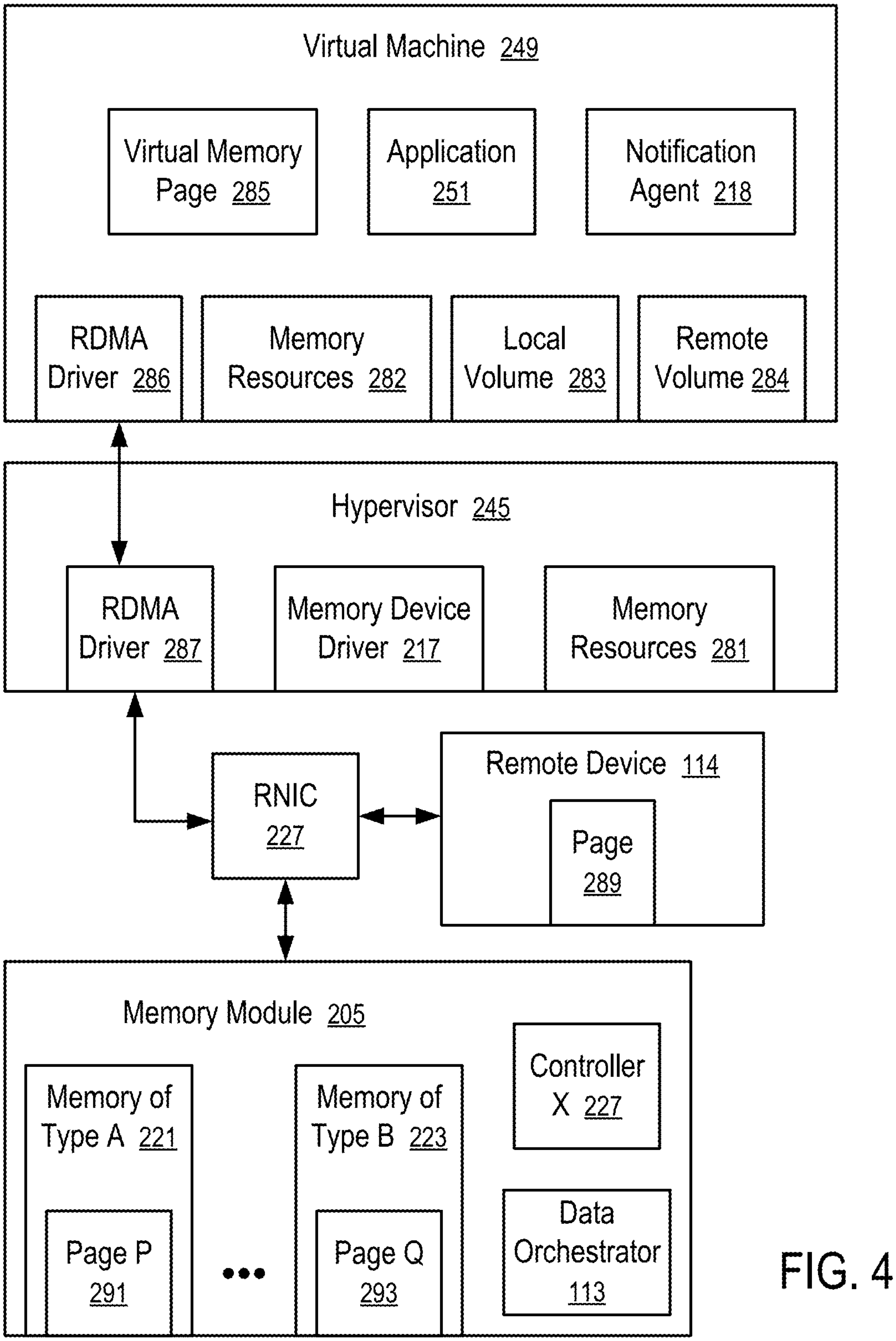
FIG. 4 illustrates an example of using remote direct memory access in an application running in a virtual machine.

FIG. 4 illustrates an example of using remote direct memory access in an application 251 running in a virtual machine 249 illustrated in FIG. 4.

The virtual machine 249 has memory resources 282 that are allocated by the hypervisor 245 from the memory resources 281 representing the memories 221, . . . , 223 of the module 205 available to the hypervisor 245 in the host system 120. The virtual machine 249 can mount a local storage device of the computer system as a local volume 283 and a remote storage device 114 as a remote volume 284. The application 251 can be programmed to request the guest operating system 243 of the virtual machine 249 to perform a remote direct memory access (RDMA) operation where a portion of the remote volume 284 is accessed as a page of the virtual memories 285.

In response to the RDMA request, the RDMA drive 286 in the guest operating system 243 can communicate with the RDMA drive 287 in the hypervisor 245 or the host operating system 241 to send a command to the RNIC 227, which copies the data of a page 289 from the remote device 114 to or from a page 291 (or 293) in the memory module 205.

Optionally, the application 251 explicit requests a virtual page 285 allocated for the RDMA operation to be locked to a page 291 (or 293) in the memory module 205 (e.g., via the requirement of pinning or paging on demand). Alternatively, a notification agent 218 is connected to the application 251 and/or the guest operating system 243 to detect the RDMA operation request and, in response, lock the virtual page 285 to the page 291 (or 293) in the memory module 205. In some instances, the memory device driver 217 of the memory module 205 is informed of the RDMA operation request and thus locks the virtual page 285 to the page 291 (or 293) in the memory module 205 as a response.

Optionally, after the completion of RDMA data transfer operation, the application 251 and/or the RDMA driver (e.g., 286 or 287) can request the unlocking of the virtual memory page 285 from the page 291 (or 293) in the memory module 205. For example, a notification agent 218 is connected to the application 251 and/or the guest operating system 243 to detect the completion of the RDMA operation request and in response, unlock the virtual page 285 from the page 291 (or 293) in the memory module 205. In some instances, the memory device driver 217 of the memory module 205 is informed of the completion of the RDMA operation request and unlocks the virtual page 285 from the page 291 (or 293) in the memory module 205 as a response.

In some instances, the application 251 can be programmed to request the guest operating system 243 of the virtual machine 249 to perform a direct memory access (DMA) operation where a portion of the local volume 283 is accessed as a page 285 of virtual memory. For example, a DMA controller can be connected to the memory bus 203 and the peripheral interconnect 207 to transfer data between a page 291 (or 293) of memory in the memory module 205 and a storage device coupled to the peripheral interconnect 207; and the data transfer can be performed without the involvement of the host system 120, as in the RDMA operation. In such a situation, the virtual memory page 285 involved in the DMA operation can be locked/unlocked in a way similar to the locking/unlocking of the page 285 for the RDMA operation.

Figure 5:
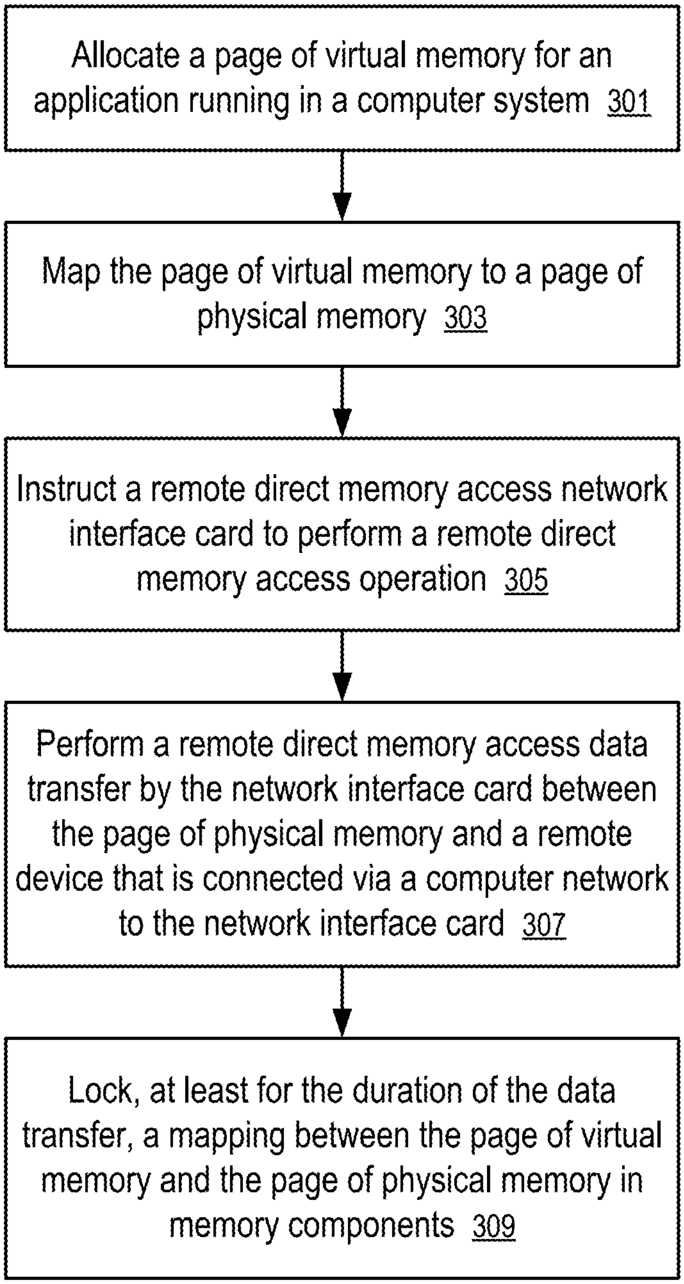
FIG. 5 shows a method of remote direct memory access.

FIG. 5 shows a method of remote direct memory access. The method of FIG. 5 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 5 is performed at least in part by the data orchestrators 113 of FIGS. 1-4. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 5 can be implemented in a computing system of FIG. 1, 2, 3, or 4 for remote direct memory access in connection with intelligent data movements using a memory sub-system 110 of FIG. 1, a RNIC 227 and a data orchestrator 113 of FIG. 2, a hypervisor 245 of FIG. 3, and/or a virtual machine 249 of FIG. 4. For example, the data orchestrators 113 can be implemented at least in part via the controller 115 of a memory sub-system 110, such as the controller 227 of a memory module 205 of FIG. 2 and the processing device 118 and the controller 116 of the host system 120 of FIG. 1. Optionally, the data orchestrator 113 can include the predictive data movement techniques discussed further below in connection with FIGS. 6-9.

At block 301, a computer system allocates a page 285 of virtual memory for an application 251 running in the computer system.

For example, the application 251 can run in a virtual machine 249 that is hosted in the computer system and that is controlled by a guest operating system 243, as illustrated in FIGS. 3 and 4. Alternatively, the application 251 can run in the operating system 241 without a hypervisor 245 or a virtual machine 249.

At block 303, the computer system maps the page 285 of virtual memory to a page 291 (or 293) of physical memory.

For example, the computer system has a memory module 205. The memory module 205 has different tiers of memories (e.g., 221, . . . , 223) that have different performance levels (e.g., different memory access speed). When the computer system maps the page 285 of virtual memory to a page 291 (or 293) of physical memory, access to the page 285 of virtual memory allocated to the application 251 results in memory access to the page 291 (or 293) of physical memory in the memory module.

At block 305, the computer system instructs a remote direct memory access network interface card 227 to perform a remote direct memory access operation. The RDMA network interface card (RNIC) 227 has a connection to the host system 120 (e.g., via a peripheral interconnect 207) to communicate with the host system 120 before and after the RDMA operation. The RNIC 227 does not communicate to the host system 120 for the RDMA data transfer during the RDMA operation. The RNIC 227 has a connection to the memory module 205 (e.g., via a memory bus 203) that does not go through the host system 120; and the RNIC 227 has a network connection to the remote device 114 that also does not go through the host system 120. Thus, the RNIC 227 can perform the RDMA data transfer independent of the host system 120 once the request for the RDMA operation is received.

For example, the application 251 can request the operating system 243 and/or 241 to access a portion of a remote volume 284 via the page 285 of virtual memory allocated to the application 251. The request can be carried out using remote direct memory access (RDMA) drivers 286 and 287.

At block 307, the remote direct memory access network interface card 227 performs a remote direct memory access data transfer between the page 291 (or 293) of physical memory and a remote device 114 that is connected via a computer network 219 to the network interface card 227. The remote direct memory access data transfer can be performed by the RDMA network interface card 227 independent of operations of the host system 120 and/or the operating system (241/243) running in the host system 120. The host system 120 and/or the operating system (241/243) running in the host system 120 can perform operations in parallel with the data transfer controlled by the RNIC 227. For example, the RNIC 227 transfers the data of the page 289 in the remote device 114 to the page 291 (or 293) of the memory module 205 without involvement of the host system 120 and/or the operating system (241/243).

At block 309, the data orchestrator 113 in the computer system locks, at least for the duration of the RDMA data transfer, a mapping between the page 285 of virtual memory and the page 291 (or 293) of physical memory in memory components of the computer system.

The locking of the mapping prevents other applications, computing processes, operating systems, and/or the data orchestrator 113 in the memory module 205 from using the page 291 (or 293) of physical memory outside of the context of the page 285 of virtual memory. For example, when the mapping is locked, the page 285 of virtual memory cannot be swapped out of the page 291 (or 293) of physical memory; and another page of virtual memory cannot be swapped into the page 291 (or 293) of physical memory.

The locking can be implemented by configuring the page 285 of virtual memory as being pinned to the page 291 (or 293) of physical memory, or restricting swapping of the page 285 of virtual memory to an on-demand basis. The locking of the mapping can be performed in response to the allocation of the page 285 for the application 251, in response to the use of the page 285 of virtual memory in a RDMA operation, in response to a command to the RNIC 227 to start the RDMA data transfer, and/or in response to an indication of the onset of the RDMA data transfer.

Optionally, the data orchestrator 113 in the host system 120 of the computer system can automatically unlock the mapping between the page of virtual memory and the plurality of memory components after the remote direct memory access operation and/or the RDMA data transfer. The unlocking can be implemented by removing the pinning attribute or the on-demand-paging attribute of the page 285 of the virtual memory.

For example, the data orchestrator 113 in the host system 120 can include a notification agent 218 and/or a memory device driver 217 for the memory module 205. The data orchestrator 113 in the host system can detect a completion of the RDMA data transfer via the notification agent 218 coupled to the application 251, and/or the operating system 243/241 in which the application 251 is running. In some instances, the data orchestrator 113 communicates with a remote direct memory access driver (e.g., 286 or 287) to detect the completion of the RDMA data transfer.

In some instances, the data orchestrator 113 in the host system 120 detects a completion of the data transfer via a hypervisor 245 that hosts the virtual machine 249 in which the application 251 is running. For example, the detection can be made in connection with a communication with the remote direct memory access driver 287 running in the hypervisor 245 and/or a device driver 217 for the memory module 205.

Optionally, the remote direct memory access network interface card (RNIC) 227 can implement single root input/output virtualization to provide a physical function and a plurality of virtual functions. An RDMA driver 286 in the virtual machine 249 is used to access the virtual function of the RNIC 227; and an RDMA driver 287 in the hypervisor 245 controls the access to the physical function of the RNIC 227. The hypervisor 245 can include a device driver 217 that locks the mapping of the page 285 of the virtual memory for the during of the RDMA data transfer.

The memory module 205 can have different tiers of memories. For example, memory 221 can be faster than memory 223; the faster memory 221 can be volatile dynamic random access memory; and the slower memory 223 can be non-volatile cross point memory. When the slower memory 223 is fast enough to support the RDMA data transfer, the computing system can automatically lock the page 285 of virtual memory to the page 293 in the slower memory 223 for the duration of the RDMA data transfer, instead of locking the page 285 to the page 291 in the faster memory 221.

For example, just before the RDMA data transfer, the data orchestrator 113 can swap the page 285 of virtual memory to the page 293 of the slower memory 223 from the page 291 of the faster memory 221; the RDMA data transfer is made using the page 293 of the slower memory 223; and after the RDMA data transfer, the data orchestrator 113 can swap the page 285 of virtual memory from the page 293 of the slower memory 223 to the page 291 of the faster memory 221 (e.g., based on a workload prediction).

Optionally, the memory module 205 can have a controller configured to perform predictive data movements across the different tiers of memories 221, . . . , 223. The controller can implement the data orchestrator 113 using a field programmable gate array (FPGA) or an application specific integrated circuit (ASIC) that predicts data movements using an artificial neural network, as further discussed below.

The data orchestrator 113 can predict data usages and movements across different tires of memories, faster memory (e.g., 109A) and slower memory (e.g., 109N). Applications may access certain data in sequences; and certain objects may be used together. Thus, the use of a data item in a user account, in an application, in a virtual machine, as part of an object, can be indication of the subsequent use of another related data item. Before the related data item is accessed, the data orchestrator 113 can instruct the controller 115 to rearrange the physical storage locations of the data items in the memory sub-system 110, such that at a time when the processing device 118 of the host system 120 accesses the related data item, the data item is already in the faster memory (e.g., 109A). Thus, the operation performance of the computing system is improved. The predictive model of the data orchestrator 113 can be implemented via an artificial neural network, which can be initially trained offline using historic data access records initially and then continuously trained in real time use using the real time data access records.

In one example, the central processing unit (CPU) can access two sets of memory provided in one or more memory systems connected to the CPU. For example, one set of memory can be slower than the other set of memory; and the central processing unit (CPU) can be configured to access the slower set of memory via the faster set of memory using a paging technique. The faster set of memory can be used as the cache memory of the slower set of memory. For example, one set of memory cannot be directly addressable by the CPU and is coupled to the other set of memory that is directly addressable by the CPU; and the central processing unit (CPU) can be configured to access a set of memory that is not directly addressable via the set of memory that is directly addressable in a way similar to the use of the paging technique. The set of memory that can be accessed directly can be used as the cache memory of the set of memory that cannot be accessed directly.

When a faster memory is used as a cache of a slower memory, the data stored in the faster memory has a corresponding copy in the slower memory. When the faster memory is changed, the corresponding copy in the slower memory becomes out of date. The changed content in the faster memory is to be flushed to the slower memory for update.

Alternatively, the content in the slower memory can be accessed without going through the faster memory in some instances; and the content in the faster memory may not have a corresponding copy in the slower memory. The distribution of the content in the slower memory and the faster memory can be dynamically changed to optimize the operating performance for the current workload. In such a situation, the faster memory can still be considered as a cache for tracking cache hit ratio. For example, if a data item being accessed is serviced from the faster memory, a cache hit is counted; and if a data item being accessed is serviced from the slower memory, a cache miss is counted.

In some instances, a memory virtualizer can be implemented in a device driver of a memory component to virtualize memory access to the memories of different tiers to shield the differences in the memory components 109A to 109N from applications and/or virtual machines. The memory virtualizer automatically adjusts data storage locations across the memories of different tiers to optimize the performance of the computing system. Some details and examples of memory virtualizers can be found in U.S. patent application Ser. No. 16/054,719, filed Aug. 3, 2018, issued as U.S. Pat. No. 11,416,395 on Aug. 16, 2022 and entitled "memory virtualization for accessing heterogeneous memory components."

When a data item being accessed is in the slower set of memory but not in the faster set of memory, the data item can be accessed in the slower set of memory directly, or swapped to the faster set of memory for accessing in the faster set of memory, or cached in the faster set of memory. If the workload of accessing the data item is predicted by the data orchestrator 113, the data orchestrator 113 instructs the controller 115 to swap the data item to the faster set of memory, or cache the data item in the faster set of memory, before the data access. After the data movement performed in accordance with workload prediction, the data access can be served from the faster set of memory when the data item is accessed. Since the data access is serviced from the faster set of memory, the time to complete the data access is shorter than servicing from the slower set of memory, or swapping to the faster set of memory for servicing, or loading the data from the slower set of memory to the faster set of memory for caching and then servicing.

For example, when a page of virtual memory being accessed is currently in the slower set of memory but not in the faster set of memory, a page can be allocated from the faster set of memory to service the page in the slower set of memory; and the data of the page can be fetched from the slower set of memory and stored in the allocated page in the faster set of memory, such that the data access of the page of the virtual memory can be made via accessing the allocated page in the faster set of memory in subsequent operations.

In some instances, swapping a page takes a time longer than simply access a requested data element from the slower memory. Thus, the requested data element is first serviced to the requester, while the page swapping is performed to speed up subsequent access to the data elements in the hot page. Thus, the overall performance is better than holding the request for the data element until the page swap is completed.

Further, information related to the use of the pages in the slower set of memory can be used to train a self-learning prediction engine in predicting the use of the pages. For example, a supervised machine learning technique can be used to train, using the information, an artificial neural network to predict the use of the pages in the slower set of memory by reducing the errors between predictions and the actual use of the pages. After the training of the artificial neural network, the prediction engine can use the current information to predict the next pages to be used. Further, the training, prediction, and feedback from the actual usage following the prediction for further training can be performed in a continuous fashion to adapt the prediction model of the artificial neural network to the most recent usage patterns of memory pages.

In response to the memory usage prediction that a page in the slower set of memory is to be used soon, the data orchestrator 113 can instruct the controller 115 to proactively swap or cache the page of data from the slower set of memory to the faster set of memory, such that when needed for processing, the page of data is already in the faster set of memory, which arrangement improves the data access speed of the page of data.

The accuracy of the prediction can be measured against the subsequent actual page use; and the prediction and the subsequent actual page use can be used to further train or adjust the artificial neural network to track the most recent usage patterns of memory pages.

Alternatively, or in combination, the machine learning-based prediction can be replaced or augmented with policy based prediction rules. For example, pages storing resident codes (e.g., in lower addresses) can be maintained in the faster set of memory when possible to reduce swapping of frequently used pages. For example, a huge page can be loaded into the faster set of memory when a page that is a portion of the huge page is being accessed. For example, predictions can be made at least in part using heuristic rules, based on indications such as whether the pages are accessed sequentially or randomly, whether the data access is in a steady state mode or in a burst mode, and/or the logical relations between pages (and pages of different sizes).

Some details and examples regarding the prediction techniques can be found in U.S. patent application Ser. No. 16/032,331, filed Jul. 11, 2018 and entitled "Predictive Paging to Accelerate Memory Access."

FIG. 6 shows a computing system having different tiers of memory and a data orchestrator to optimize data locations in accordance with at least some embodiments disclosed herein.

The computing system of FIG. 6 includes a host system 120, a memory module 205 connected to the host system 120 via a memory bus 203, and a storage device 209 connected to the memory module 205 via an interconnect 207. The storage device 209 and/or the memory module 205 are examples of the memory sub-system 110 illustrated in FIG. 1.

The host system 120 has a processing device 118, which can be a central processing unit or a microprocessor with one or more processing cores. The host system 120 can have a memory management unit 213 and cache memory 211. The memory management unit 213 and/or at least a portion of the cache memory 211 can be optionally integrated within the same integrated circuit package of the processing device 118.

The memory module 205 illustrated in FIG. 6 has multiple types of memory (e.g., 221 and 223). For example, memory of type A 221 is faster than memory of type B 223.

For example, the memory bus 203 can be a double data rate bus; and the interconnect 207 can be a peripheral component interconnect express (PCIe) bus, a serial advanced technology attachment (SATA) bus, a universal serial bus (USB) bus, and/or a storage area network. Memory of type B 223 in the memory module 205 can be accessed at a speed faster than accessing memory of type B 223 in the storage device 209.

The storage device 209 illustrated in FIG. 6 has multiple types of memory (e.g., 223 and 225). For example, memory of type B 223 is faster than memory of type C 225.

In general, a plurality of memory modules (e.g., 205) can be coupled to the memory bus 203; and a plurality of storage devices (e.g., 209) can be coupled to the peripheral interconnect 207. In some instances, the peripheral interconnect 207 and the storage devices (e.g., 209) are optional and can be absent from the computing system. In other instances, the memory bus 203 and the memory modules (e.g., 205) can be optional and can be absent from the computing system.

In a possible configuration when a plurality of memory modules (e.g., 205) are coupled to the memory bus 203, one of the memory modules (e.g., 205) has memory of type A 221; and another of the memory modules has memory of type B 223 that is accessible at a speed lower than the memory of type A 221 in a separate memory module (e.g., 205).

Similarly, in a possible configuration when a plurality of storage devices (e.g., 209) are coupled to the interconnect 207, one of the storage device (e.g., 209) has memory of type B 223, and another of the storage devices has memory of type C 225 that is accessible at a speed lower than the memory of type B 223 in a separate storage device (e.g., 209).

The processing device 118 and/or the MMU 213 are configured via instructions (e.g., an operating system and/or one or more device drivers) to access a portion of memory in the computer system via another portion of memory in the computer system using a paging technique and/or a memory map interface.

For example, memory of type B 223 of the memory module 205 can be accessed via memory of type A 221 of the memory module 205 (or another memory module).

For example, memory of type B 223 of the storage device 209 can be accessed via memory of type A 221 of the memory module 205 and/or via memory of type B 223 of the memory module 205.

For example, memory of type C 225 of the storage device 209 can be accessed via memory of type A 221 of the memory module 205, via memory of type B 223 of the memory module 205, and/or via memory of type B 223 of the storage device 209 (or another storage device).

For example, in some instances, memory of type A 221 and memory of type B 223 in the same memory module 205 (or different memory modules) are addressable directly and separately over the memory bus 203 by the memory management unit 213 of the processing device 118. However, since the memory of type B 223 is slower than memory of type A 221, it is desirable to access the memory of type B 223 via the memory of type A 221.

In other instances, memory of type B 223 of the memory module 205 is accessible only through addressing the memory of type A 221 of the memory module 205 (e.g., due to the size restriction in the address portion of the memory bus 203).

The data orchestrator 113 can instruct a controller X 227 in the memory module 205 to perform data transfer/movement between the memory of type A 221 and the memory of type B 223 within the memory module 205, especially when the memory of type B 223 of the memory module 205 is not directly addressable using the memory bus 203.

Further, the data orchestrator 113 can instruct a controller X 227 in the memory module 205 to communicate with a controller Y 229 in the storage device 209 to perform data transfer/movement between memories 223 to 225 in the storage device 209, and/or between the storage device 209 and the memory module 205.

In one variation, the memory (e.g., 221 and 223) of the memory module 205 can have the same performance individually within the memory module 205; however, the memory management unit 213 and/or the processing device 118 are restricted to access via the memory 223 via the memory 221 (e.g., due to the size restriction in the address portion of the memory bus 203). Thus, the memory 223 appears to be slower than the memory 221 to the processing device 118.

In general, the memory sub-systems (e.g., 205 and 209) can include media, such as memory (e.g., 221, . . . , 223, . . . , 225). The memory (e.g., 221, . . . , 223, . . . , 225) can include volatile memory, non-volatile memory (NVM), and/or a combination of such. In some embodiments, the computer system includes at least one memory sub-system that is a storage device 209. An example of a storage device 209 is a solid-state drive (SSD). In some embodiments, the computer system includes at least one memory sub-system that is a hybrid memory/storage system configured as a memory module 205. The processing device 118 can write data to each of the memory sub-systems (e.g., 205 and 209) and read data from the memory sub-systems (e.g., 205 and 209) directly or indirectly.

The computing system of FIG. 6 can be used to implement a desktop computer, laptop computer, network server, mobile device, or such computing device that includes a memory and a processing device. The processing device 118 can read data from or write data to the memory sub-systems (e.g., 205 and 209).

In some instances, the interconnect 207 is connected to the host system 120 without going through the memory module 205 and/or the memory bus 203. When the storage device 209 is coupled to the host system 120 without going through the memory module 205 (e.g., as illustrated in FIG. 2), a data orchestrator 113 can be implemented in the storage device 209 in a way similar to the data orchestrator 113 in the memory module 205.

In some instances, the data orchestrator 113 can be implemented at least in part in the host system 120.

Figure 7:
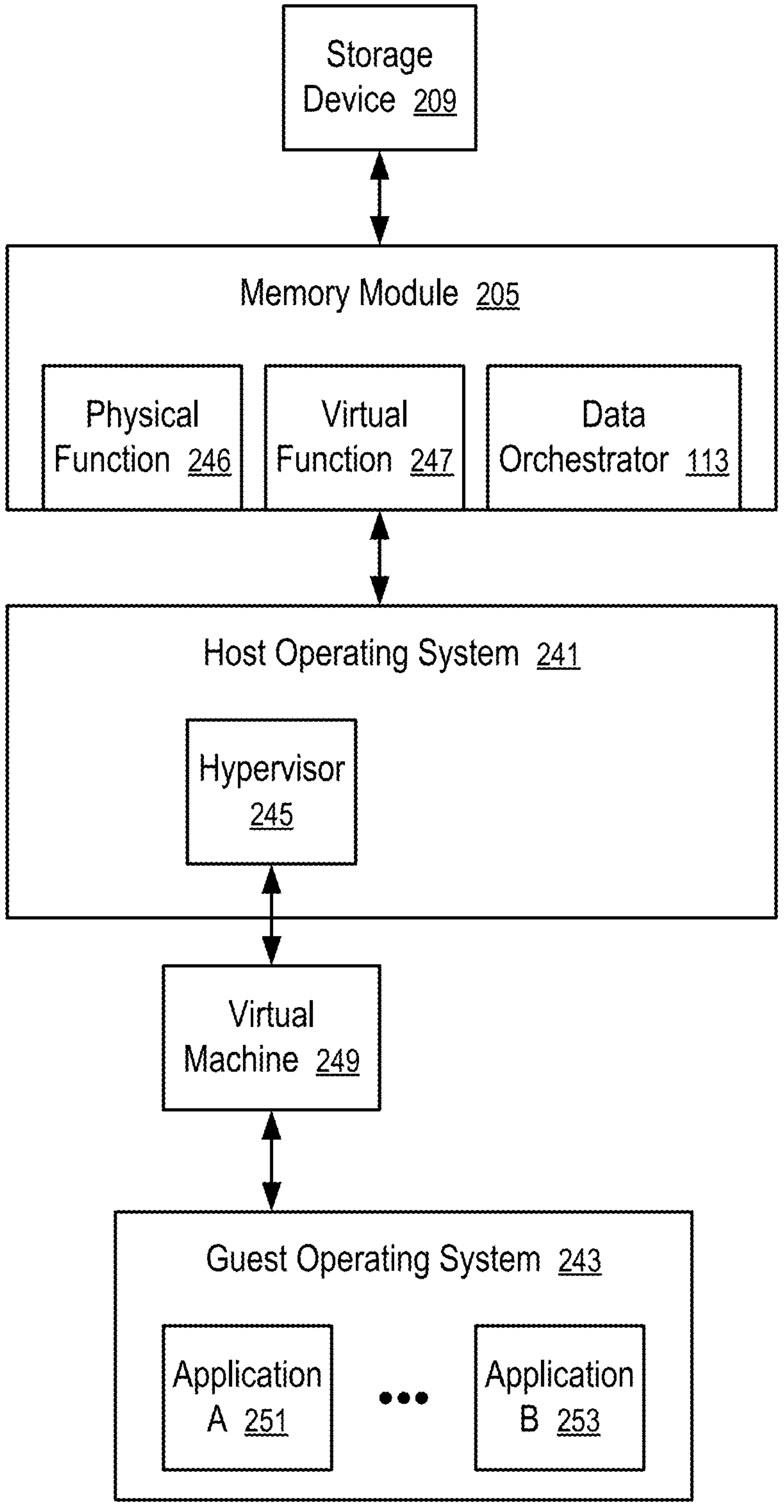
FIG. 7 shows a system having a data orchestrator.

FIG. 7 shows a system having a data orchestrator 113. For example, the system of FIG. 7 can be implemented in a computer system of FIG. 1, 2, 3, 4, or 6.

The system of FIG. 7 includes a host operating system 241 that can run in the processing device 118 of the computer system of FIG. 1, 2, 3, 4, or 6. The host operating system 241 includes one or more device drives that provides memory services using the memory (e.g., 221, . . . , 223, . . . , 225) of memory sub-systems, such as the memory module 205 and/or the storage device 209.

The host operating system 241 includes a hypervisor 245 that provisions a virtual machine 249. The virtual machine 249 has virtual hardware implemented via the resources and services provided by the host operating system 241 using the hardware of the computing system of FIG. 1, 2, 3, 4, or 6. For example, the hypervisor 245 can provision virtual memory as part of the virtual machine 249 using a portion of the memory (e.g., 221, . . . , 223, . . . , 225) of memory sub-systems, such as the memory module 205 and/or the storage device 209.

The virtual machine 249 allows a guest operating system 243 to provide resources and/or services to applications (e.g., 251, . . . , 253) running in the guest operating system 243, in a way as the operating system 243 running on a physical computing machine that has the same or similar set of hardware as provisioning in the virtual machine. The hypervisor 245 manages the mapping between the virtual hardware provisioned in the virtual machine and the services of hardware in the computing system managed by the host operating system 241.

FIG. 7 illustrates an instance in which a virtual machine 249 is provisioned by the hypervisor 245. In general, the hypervisor 245 can provision a plurality of virtual machines (e.g., 249) that can run the same guest operating system 243, or different guest operating systems (e.g., 243). Different sets of users and/or application programs can be assigned to use different virtual machines.

In some instances, the host operating system 241 is specialized to provide services for the provisioning of virtual machines and does not run other application programs. Alternatively, the host operating system 241 can provide additional services to support other application programs, such as applications (e.g., 251, . . . , 253).

In FIG. 7, the hypervisor 245 is configured to use a single-root I/O virtualization to organize data streams of different characteristics/attributes. For example, the memory module 205 has a physical function 246 that can implement a plurality of virtual functions (e.g., 247). A virtual function 247 provides the service of the memory module 205 via the physical function 246. The hypervisor 245 allocates and reserves the virtual function 247 for memory access by a particular virtual machine 249, a particular application (e.g., 251 or 253), a particular user account, etc. Thus, the identifier of the virtual function 247 used to access the memory module 205 can be used to infer the data usage information of the data access, such as the identities of the virtual machine 249, the application 251 and/or the user account that are associated with and/or responsible for the data access made using the virtual function 247. Such information can be used in the data orchestrator 113 in machine learning to predict data workload and/or movements and in making real time predictions.

For example, the data orchestrator 113 can be trained to predict the use of a data item in a slower memory and load the data item into a faster memory before the data item actually requested for use by the virtual machine 249, the application 251 running in the virtual machine, and/or a user account operating the application 251. The prediction reduces the time between a request to use the data item and the availability of the item in the faster memory by loading, transferring, and/or, caching the item into the faster memory before the request to use the item reaches the memory module 205, which accelerates the data access of the page.

For example, the slower memory can be the memory 223 in the memory module 205 and the faster memory be the memory 221 in the same memory module 205 (or another memory module connected to the same memory bus 203 as the memory module 205).

For example, the slower memory can be the memory 223 in the storage device 209; and the faster memory can be the memory 223 of the same type in the memory module 205, or the memory 221 in the memory module 205.

For example, the slower memory can be the memory 225 in the storage device 209; and the faster memory can be the memory 223 in the same storage device 209 or another storage device connected to the interconnect 207, or memory (e.g., 223 or 221) in the memory module 205.

Preferably, the predictive data movement is performed within a same memory sub-system, such as within the same memory module 205, the same storage device 209, or the same combination of the memory module 205 and the storage device 209, to avoid or reduce congestion in communication channels connected to the processing device 118, such as the memory bus 203 and/or the interconnect 207. For example, the predictive data movement can be performed to copy data from the slower memory 223 in the memory module 205 to the faster memory 221 in the memory module 205, under the control of a controller 227 in the memory module 205 in response to one or more command, request, or instruction from the data orchestrator 113. For example, the predictive data movement can be performed to copy data from the slower memory 225 in the storage device 209 to the faster memory 223 in the storage device 209, under the control of a controller 229 in the storage device 209 in response to one or more command, request, or instruction from the data orchestrator 113. For example, the predictive data movement can be performed to copy data from the storage device 209 to the memory module 205, under the control of the controller 227 and the controller 229 in the storage device 209, in response to one or more command, request, or instruction from the data orchestrator 113.

In one embodiment, the hypervisor 245 not only requests the device driver to access a memory (e.g., 221, . . . , 223, . . . , or 225) in a memory sub-system (e.g., memory module 205 or storage device 209) but also provides the device driver with information that can be used in making predictions of which data items in the memory (e.g., 221, . . . , 223, . . . , or 225) are likely to be used in a subsequent time period and which data items in the memory (e.g., 221, . . . , 223, . . . , or 225) are unlikely to be used in the subsequent time period. The information can be provided at least in part via the use of virtual functions (e.g., 247) that are pre-associated with certain data usage attributes, such as virtual machine 249, application 251, user account, etc.

For example, a page that is likely to be used can be referred to as a hot page; and a page that is unlikely to be used can be referred to as a cold page. The likelihood of a page being used in the subsequent time period can be referred to as the temperature of the page. The data orchestrator 113 uses the information provided/identified by the hypervisor 245 to predict the temperatures of the pages, moves cold pages from faster memory to slower memory, and moves hot pages from slower memory to faster memory to optimize the distribution of the pages in the memory (e.g., 221, . . . , 223, . . . , or 225) and accelerate data access.

Examples of information provided by the hypervisor 245 and used by the data orchestrator 113 to make the predictions include: sequences of pages being used in a prior time period, instances of requests to load pages from the slower memory to the faster memory, content attributes of the pages, ownership attributes of the pages, identifications of users or applications of the pages, an indication of whether pages are accessed in a sequential mode in a virtual machine and/or in a user account, an indication of whether page accesses are in a steady state, an indication whether a page used is associated with a huge page, mapping between data blocks and objects, etc.

Figure 8:
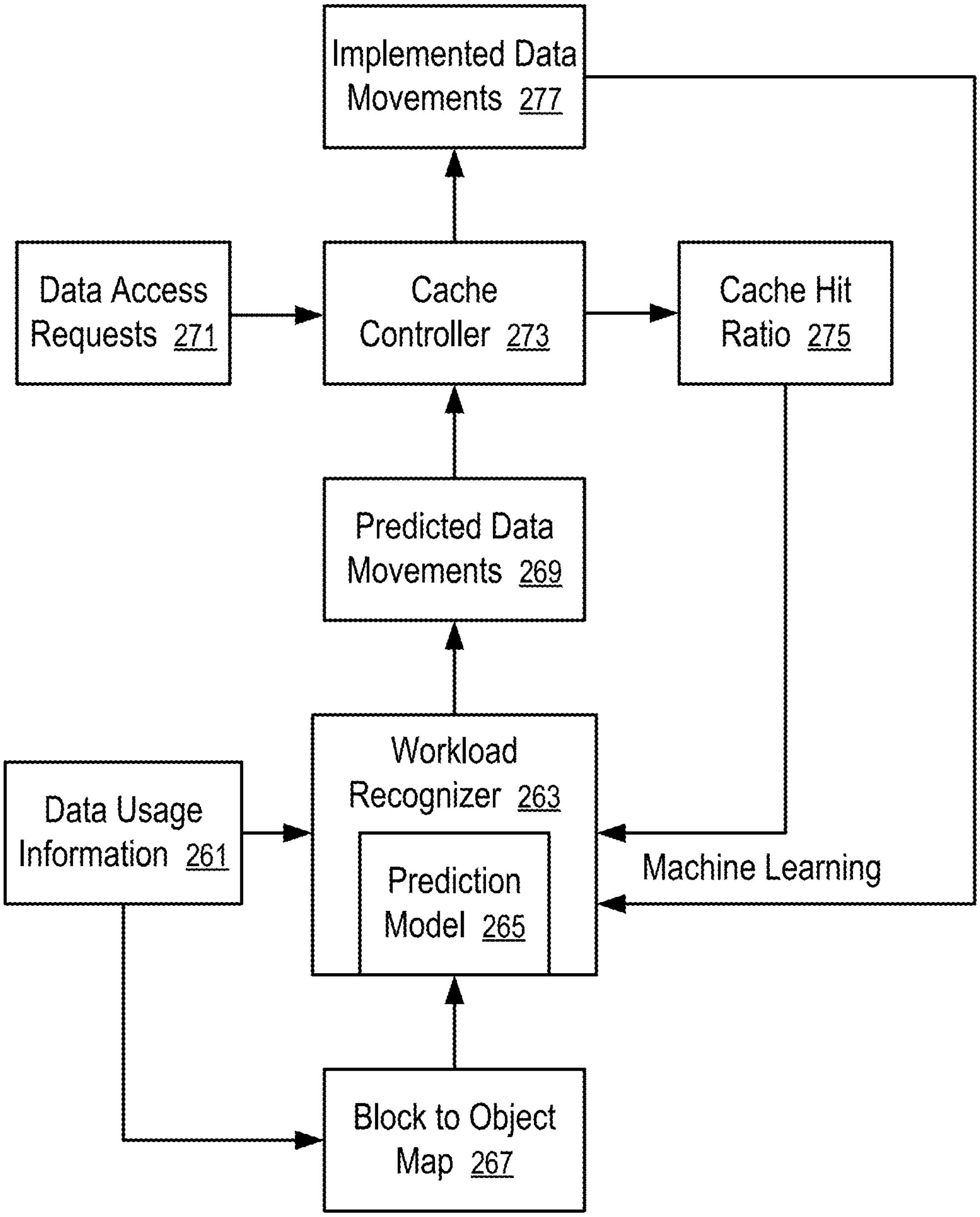
FIG. 8 illustrates an implementation of a data orchestrator.

FIG. 8 illustrates an implementation of a data orchestrator 113.

In FIG. 8, the data orchestrator 113 includes a cache controller 273 and a workload recognizer 263. The workload recognizer 263 includes a prediction model 265 that can be implemented using an artificial neural network.

The cache controller 273 processes data access requests 271 from the host system 120. The cache controller 273 monitors a higher performance memory used as a cache relative to a lower performance memory, analyzes the usage of the cache, optimizes the usage of the cache, and manages the use of the cache. Conventional cache techniques can be implemented in the cache controller 273.

In response to the data access requests 271, the cache controller 273 determines whether the data targeted by the requests 271 are in the higher performance memory at the time of the requests 271. If so, the cache controller 273 counts the corresponding data access requests 271 as cache hits; and otherwise, the cache controller 273 counts the corresponding data access requests 271 as cache misses. Thus, the cache controller 273 can generate the measurement of cache hit ratio 275 for the data distribution at the time of the data access requests 271.

Optionally, the cache controller 273 may service a portion of data access requests 271 directly from the lower performance memory without caching/loading the corresponding data into the higher performance memory.

The cache policy used the cache controller 273 can be used to identify data movements 277 that are implemented by the cache controller 273.

The data usage information 261 corresponding to the data access requests 271 is collected for an initial time period of the operation of the computing system for the training of the prediction model 265. For example, a supervised machine learning technique can be used to train the artificial neural network of the prediction model 265 to minimize the difference between the data movements 277 implemented by the cache controller 273 responsive to the data access requests 271 and the data movement 269 predicted using the prediction model 265 using the data usage information 261 corresponding to the data access requests 271. The machine learning can be performed offline on another computing device to establish the initial prediction model 265.

Subsequently, the prediction model 265 can be used in the workload recognizer 263 to make real time predictions of data movements 269 based on real time data usage information 261 and real time data access requests 271. The workload recognizer 263 instructs the cache controller 273 to perform the predicted data measurements, which can cause changes in the cache hit ratio 275. The prediction model 265 is adjusted and/or trained in real time using a hybrid reinforcement machine learning technique to continuously drive up the cache hit ratio 275. Thus, the prediction model 265 can automatically adapt to the current workload of the computing system and implement predicted data movements 269 to achieve a cache hit ratio 275 higher than that can be achieved via the cache controller 273 alone.

Preferably, the predictions made by the workload recognizer 263 are based at least in part on a block to object map 267. For a statistical analysis of the data usage information 261, the data orchestrator 113 can identify the underlying relations among data blocks. For example, some data blocks represent parts of a same data object in an application; parts of a data object are accessed together; some data objects have a pattern of being accessed in a particular order; the access to one data object in a user account running an application on a virtual machine can have a high probability of leading to the access to another data object. The block to object map 267 identifies the relations that improve the prediction accuracy of the workload recognizer 263.

Figure 9:
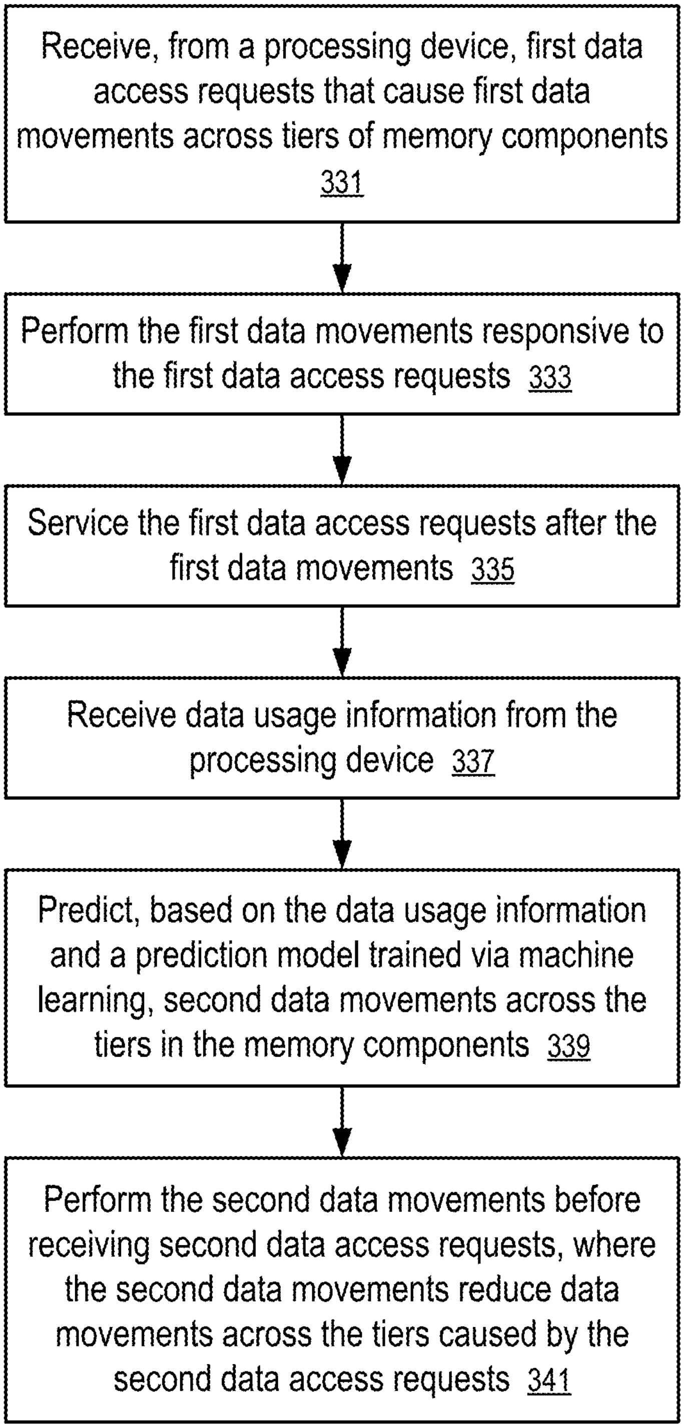
FIG. 9 shows a method of predictive data orchestration.

FIG. 9 shows a method of predictive data orchestration. The method of FIG. 9 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 9 is performed at least in part by the data orchestrator 113 of FIGS. 1-8. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 9 can be implemented in a computing system of FIG. 1, 2, 3, 4 or 6 with a host operating system 241 of FIG. 7 and a prediction model 265 of FIG. 8. For example, the data orchestrator 113 can be implemented at least in part via the cache controller 273 and the workload recognizer 263 of FIG. 8 and/or the virtual function 247 of FIG. 7.

At block 331, the data orchestrator 113 receives, from a processing device 118, first data access requests that cause first data movements across tiers of memory components.

For example, the memory components of different tiers (e.g., 109A to 109N in FIGS. 1, 221 to 223 and/or to 225 in FIG. 7) can have first memory and second memory, where the first memory functions as cache of the second memory. For example, the first memory can be volatile dynamic random-access memory; and the second memory can be non-volatile cross-point memory. In some instances, the first memory and the second memory are housed in a same memory sub-system, such as a memory module 205 or a storage device 209. In other instances, the first memory and the second memory can be housed in separate same memory sub-systems that can communicate with each other without involving the host system 120 and/or the memory bus 203.

When the processing device 118 accesses the second memory, the access requests causes caching, in the first memory, the portion of the second memory that is being access. In other instances, the first memory does not function as cache of the second memory; and in response to a request to access a data item that is in the second memory, the data orchestrator 113 determines, based on a set of policies or rules, whether or not to change the storage location of the data item from the second memory to the first memory; and if so, the data orchestrator 113 can swap the data item from the second memory to the first memory.

At block 333, the data orchestrator 113 performs the first data movements responsive to the first data access requests.

For example, the first data movements performed/implemented in response to the first data access requests can be recorded in connection with data usage information associated with the first data access requests. For example, the data usage information can identify a sequence of data blocks being used in a period of time, instances of requests to load data blocks from the second memory to the first memory, content attributes of data blocks loaded from the second memory to the first memory, ownership attributes of data blocks loaded from the second memory to the first memory, identifications of users of data blocks loaded from the second memory to the first memory, identifications of applications that cause data blocks being loaded from the second memory to the first memory, an identification of data blocks that are accessed in a sequential mode in a virtual machine, an identification of data blocks that are accessed in a sequential mode in a user account, and/or an identification of data accesses that are in a steady state.

The first data movements can be used as desired prediction results of a prediction model 265 that makes predictions using the data usage information associated with the first data access requests. For example, the prediction model 265 has an artificial neural network that can be trained using a supervised machine learning technique to reduce the different between the first data movements and the predictions made using the data usage information associated with the first data access requests. An initial training of the artificial neural network can be optionally performed offline using a separate computer and the recorded information about the first data access requests, the first data movements caused by the first data access requests, and the data usage information before the first data access requests. For example, the data orchestrator 113 can store the recorded information in a portion of memory controlled by the data orchestrator 113; and another processing device 118 can access the portion of the memory to perform the initial training for the data orchestrator 113. Alternatively, the initial training of the artificial neural network can be performed in the data orchestrator 113 until the prediction accuracy of the prediction model 265 reaches a threshold level.

At block 335, a memory sub-system 110 (e.g., memory module 205 and/or storage device 209) services the first data access requests after the first data movements. The performance of the computing system can be improved by predicting data movements and performing the predicted data movements before the corresponding data access requests.

At block 337, the data orchestrator 113 receives data usage information 261 from the processing device 118.

At block 339, the data orchestrator 113 predicts, based on the data usage information 261 and the prediction model 265 trained via machine learning, second data movements 269 across the tiers in the memory components.

At block 341, the data orchestrator 113 performs the second data movements 269 before receiving second data access requests 271. The second data movements 269 reduce data movements across the tiers caused by the second data access requests.

The data orchestrator 113 can optionally further train the prediction model based on a performance measurement of the plurality of memory components in servicing the second data access requests from the processing device 118 and/or the data movements caused by the second data access requests.

For example, the performance measurement can be a cache hit ratio of second data access requests measured by the data orchestrator 113. For example, requests of the processing device 118 for data in the second memory can cause movements of the requested data from the second memory to the first memory; such movements can be counted as cache misses; and data access requests that do not cause such movements can be counted as cache hits. The data orchestrator 113 can train the prediction model 265 using a hybrid reinforcement learning technique to drive up the cache hit ratio, reduce the count of cache misses, and/or match predictions with the desired data movements identified from the data access requests.

For example, the data orchestrator 113 can be implemented as a controller in an integrated circuit chip disposed on a memory module or a storage device, in the form of a field programmable gate array (FPGA) or an application specific integrated circuit (ASIC). The data orchestrator 113 obtains the data usage information 261 based at least in part on the identities of virtual functions (e.g., 247) in which the data access requests are used. For example, different virtual functions (e.g., 247) can be used to represent different combinations of data usage information for a period of time, such as virtual machines, applications, user accounts, data access modes, etc.

Optionally, the data orchestrator 113 further perform a statistical analysis of the data access requests 271 and data usage information 261 to identify a mapping between data blocks in the plurality of memory components and data objects as organized in applications running in the processing device. The use of the mapping with the prediction model 265 can improve the prediction accuracy of the data orchestrator 113.

Preferably, the predicted data movements 269 are performed without going through the bus (e.g., 203) that is used by the data orchestrator 113 to communicate with the host system 120.

In some implementations, a communication channel between the processing device 118 and a memory sub-system includes a computer network, such as a local area network, a wireless local area network, a wireless personal area network, a cellular communications network, a broadband high-speed always-connected wireless communication connection (e.g., a current or future generation of mobile network link); and the processing device 118 and the memory sub-system can be configured to communicate with each other using data storage management and usage commands similar to those in NVMe protocol.

A memory sub-system in general can have non-volatile storage media. Examples of non-volatile storage media include memory cells formed in an integrated circuit and magnetic material coated on rigid disks. Non-volatile storage media can maintain the data/information stored therein without consuming power. Memory cells can be implemented using various memory/storage technologies, such as NAND logic gate, NOR logic gate, phase-change memory (PCM), magnetic memory (MRAM), resistive random-access memory, cross point storage and memory devices (e.g., 3D XPoint memory). A cross point memory device uses transistor-less memory elements, each of which has a memory cell and a selector that are stacked together as a column. Memory element columns are connected via two perpendicular layers of wires, where one layer is above the memory element columns and the other layer below the memory element columns. Each memory element can be individually selected at a cross point of one wire on each of the two layers. Cross point memory devices are fast and non-volatile and can be used as a unified memory pool for processing and storage.

The controller (e.g., 227, or 229) of a memory sub-system (e.g., 205 or 209) can run firmware to perform operations responsive to the communications from the processing device 118. Firmware in general is a type of computer program that provides control, monitoring and data manipulation of engineered computing devices.

Some embodiments involving the operation of the controller 227 can be implemented using computer instructions executed by the controller 227, such as the firmware of the controller 227. In some instances, hardware circuits can be used to implement at least some of the functions. The firmware can be initially stored in the non-volatile storage media, or another non-volatile device, and loaded into the volatile DRAM and/or the in-processor cache memory for execution by the controller 227.

A non-transitory computer storage medium can be used to store instructions of the firmware of a memory sub-system (e.g., 209 or 205) and/or the instructions of the operating system (e.g., 241, 243) in general and the device driver and the hypervisor 245 in particular. When the instructions are executed by the controller 227 and/or the processing device 118, the instructions cause the controller 227 and/or the processing device 118 to perform a method discussed above.

Figure 10:
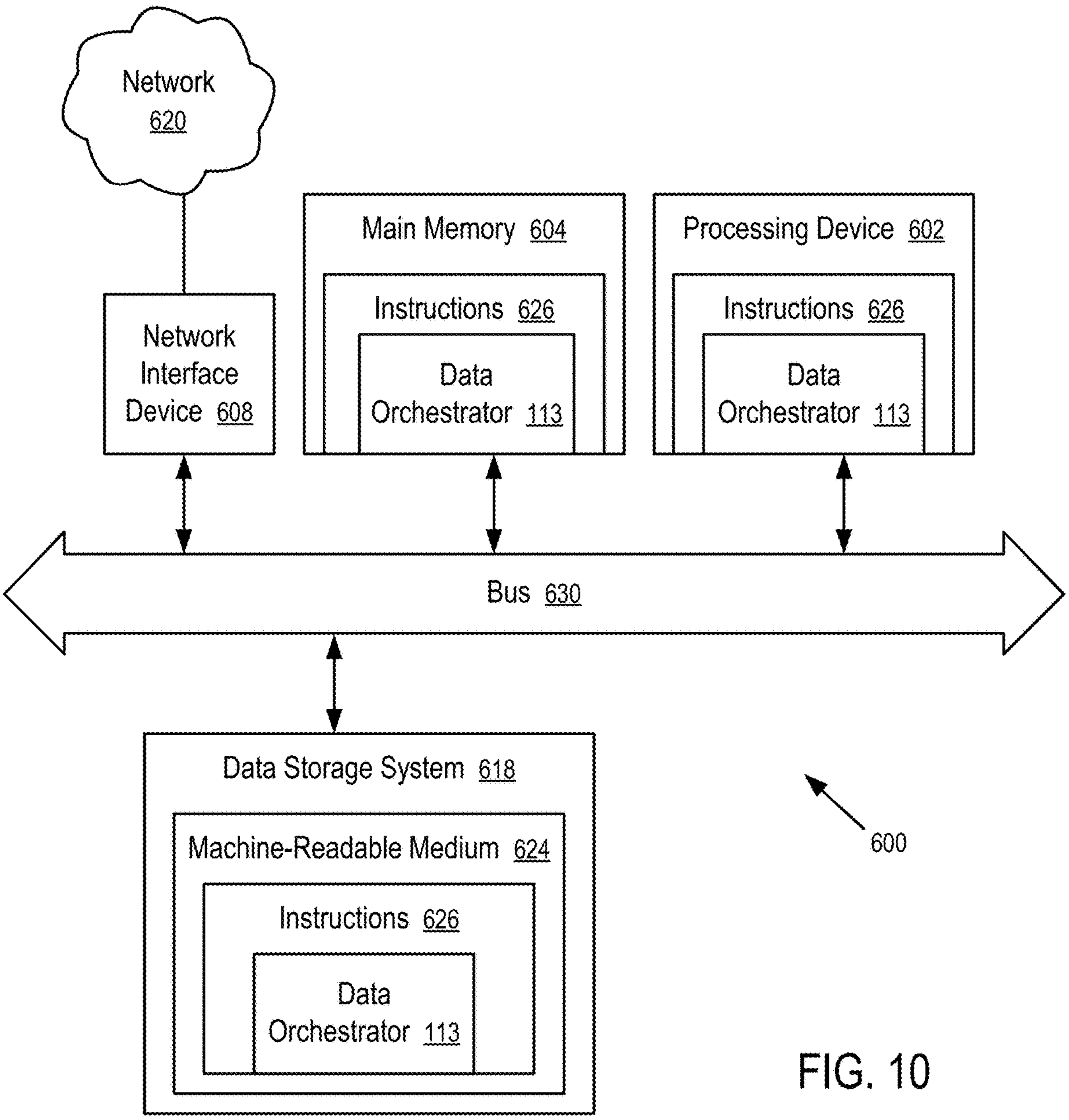
FIG. 10 is a block diagram of an example computer system in which embodiments of the present disclosure can operate.

FIG. 10 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a data orchestrator 113 (e.g., to execute instructions to perform operations corresponding to the data orchestrator 113 described with reference to FIGS. 1-9). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 618, which communicate with each other via a bus 630 (which can include multiple buses).

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a data orchestrator 113 (e.g., the data orchestrator 113 described with reference to FIGS. 1-9). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using application-specific integrated circuit (ASIC) or field-programmable gate array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device, comprising:

a remote direct memory access network interface card having:

a first interface to a memory bus;

a second interface to a peripheral interconnect; and a third interface to a computer network;

wherein the remote direct memory access network interface card is configured to transfer data between a remote apparatus connected to the computer network and a memory module configured on the memory bus in response to a command received via the peripheral interconnect;

wherein the host system is configured to run a driver in a hypervisor, the driver programmed for the remote direct memory access network interface card and configured to generate the command, and to control access to the physical function;

wherein the remote direct memory access network interface card is configured to implement single root input/output virtualization to provide a physical function and a plurality of virtual functions;

wherein the driver running in a virtual machine in the host system is configured to control access to one of the plurality of virtual functions.

2. The device of claim 1, further comprising:

the memory bus; and the memory module connected to the memory bus.

3. The device of claim 2, further comprising:

the peripheral interconnect; and a host system connected to the memory bus and connected to the peripheral interconnect to send the command.

4. The device of claim 1, wherein the memory module includes a first memory and a second memory slower than the first memory; and the remote direct memory access network interface card is configured to transfer the data of a virtual memory page between the remote apparatus and the second memory in the memory module.

5. The device of claim 4, wherein the host system is configured to:

map the virtual memory page to the second memory before the remote direct memory access network interface card transferring the data between the remote apparatus and the second memory in the memory module; and prevent the virtual memory page from being mapped to the first memory during the remote direct memory access network interface card transferring the data between the remote apparatus and the second memory in the memory module.

6. The device of claim 5, wherein the driver running in the hypervisor in the host system is configured to detect a completion of the remote direct memory access network interface card transferring the data between the remote apparatus and the second memory in the memory module; and the host system is configured to allow the virtual memory page to be mapped to the first memory after the completion.

7. The device of claim 6, wherein the first memory is a volatile memory and the second memory is a non-volatile memory.

8. A method, comprising:

connecting a first interface of a remote direct memory access network interface card to a memory bus;

connecting a second interface of the remote direct memory access network interface card to a peripheral interconnect;

connecting a third interface of the remote direct memory access network interface card to a computer network;

receiving, in the remote direct memory access network interface card via the peripheral interconnect, a command;

transferring, in response to the command, data between a remote apparatus connected to the computer network and a memory module configured on the memory bus, wherein the memory module includes a first memory and a second memory slower than the first memory;

running, in the host system, a driver programmed for the remote direct memory access network interface card and configured to generate the command;

wherein the remote direct memory access network interface card is configured to transfer the data of a virtual memory page between the remote apparatus and the second memory in the memory module.

9. The method of claim 8, wherein a host system connected to the memory bus and connected to the peripheral interconnect is configured to send the command.

10. The method of claim 8, further comprising:

mapping the virtual memory page to the second memory before the remote direct memory access network interface card transferring the data between the remote apparatus and the second memory in the memory module; and preventing the virtual memory page from being mapped to the first memory during the remote direct memory access network interface card transferring the data between the remote apparatus and the second memory in the memory module.

11. The method of claim 10, further comprising:

detecting, by the driver running in the host system, a completion of the remote direct memory access network interface card transferring the data between the remote apparatus and the second memory in the memory module; and allowing, after the completion, the virtual memory page to be mapped to the first memory.

12. The method of claim 11, wherein the first memory is a volatile memory and the second memory is a non-volatile memory.

13. A non-transitory computer storage medium storing instructions which, when executed by a computing system, cause the computing system to perform a method, the method comprising:

generating a command to a remote direct memory access network interface card having:

a first interface connected to a memory bus; a second interface connected to a peripheral interconnect; and a third interface connected to a computer network;

before sending the command to the remote direct memory access network interface card to cause the remote direct memory access network interface card to transfer data of a virtual memory page between a remote apparatus connected to the computer network and a memory module configured on the memory bus:

preventing the virtual memory page from being mapped to first memory of the memory module for duration of the remote direct memory access network interface card transferring the data between the remote apparatus and the memory module; and mapping the virtual memory page to a second memory of the memory module at last for the duration of the remote direct memory access network interface card transferring the data between the remote apparatus and the second memory in the memory module; and sending, via the peripheral interconnect to the remote direct memory access network interface card, the command.

14. The non-transitory computer storage medium of claim 13, wherein the method further comprises:

detecting a completion of the remote direct memory access network interface card transferring the data between the remote apparatus and the second memory in the memory module; and allowing, after the completion, the virtual memory page to be mapped to the first memory.

15. The non-transitory computer storage medium of claim 13, wherein the first memory is a volatile memory and the second memory is a non-volatile memory.

* * * * *